United States Patent [19]
Bartley et al.

[11] Patent Number: 5,394,125
[45] Date of Patent: Feb. 28, 1995

[54] DIMENSIONAL STABILIZATION OF MICROWAVE SHEET METAL BOUNDED CAVITIES

[75] Inventors: Paul L. Bartley, West Newbury, Mass.; Claire T. Kerr, Morris Plains, N.J.

[73] Assignee: AT&T Corp., Murray Hill, N.J.

[21] Appl. No.: 146,836

[22] Filed: Oct. 29, 1993

[51] Int. Cl.⁶ .......................... H01P 7/06; H03F 3/68
[52] U.S. Cl. ..................... 333/227; 333/136; 330/286
[58] Field of Search .................. 333/125–127, 333/136, 137, 227–232; 330/286, 295

[56] References Cited

U.S. PATENT DOCUMENTS

| | | | |
|---|---|---|---|
| 4,724,400 | 2/1988 | Luettgenau | 333/136 X |
| 5,032,798 | 7/1991 | Myer | 330/295 |
| 5,159,290 | 10/1992 | Bartley-Myer | 330/295 |

*Primary Examiner*—Seungsook Ham
*Attorney, Agent, or Firm*—Ruloff F. Kip, Jr.

[57] ABSTRACT

A microwave cavity closure structure encloses an upper splitter cavity bounded at its top and bottom by, respectively, a rigid metal plate and a flexible sheet metal dish and (b) a lower combiner cavity bounded at its top and bottom by another such dish and another lower such plate. Each such cavity has a central region occupied by a raised circular boss, and the lower plate bounding the bottom cavity mounts, outward of the central boss, two concentric annular sheet metal rings each having a flat top and peripheral flanges extending from the margins of that top down into annular grooves in the lower plate. One or more rings of dielectric posts are disposed in each cavity radially between the central boss therein and the cavity periphery to vertically space at the ring's location the plate and dish of the cavity by a distance determined by the posts, while concurrently permitting the dish to be flexed in the cavity's central region for cavity tuning purposes. Each interior of each annular ring in the combiner cavity is filled with V-shaped segments of metal coil stock ribbon which space apart the top portion of the ring and the underlying portion of the lower plate by a distance determined by those segments.

7 Claims, 13 Drawing Sheets

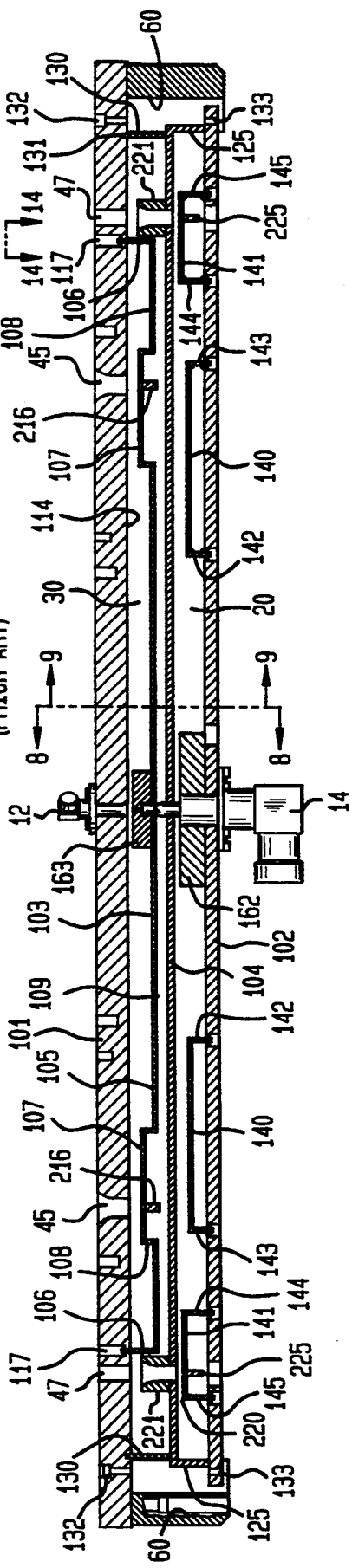
FIG. 7 (PRIOR ART)
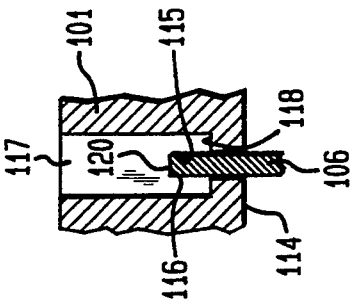
FIG. 15 (PRIOR ART)
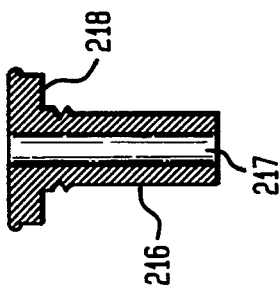
FIG. 11 (PRIOR ART)
FIG. 12
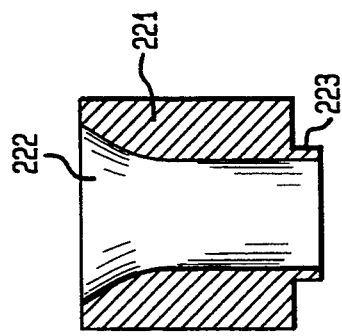
FIG. 13 (PRIOR ART)

1

DIMENSIONAL STABILIZATION OF MICROWAVE SHEET METAL BOUNDED CAVITIES

TECHNICAL FIELD

This invention relates generally to apparatus in which electromagnetic microwave energy is distributed via a divider cavity to a plurality of amplifiers, and is then amplified in parallel by these amplifiers, and in which the separate outputs from these amplifiers are then merged via a combiner cavity to provide a single amplified output of such energy from such apparatus. More particularly, this invention relates to improvements in such cavities and in the closure means therefor.

BACKGROUND OF THE INVENTION

In U.S. Pat. No. 5,159,290 issued Oct. 27, 1992 in the name of Paul L. Bartley and Robert E. Myer for "Composite Wave Closure Means For Microwave Containing Regions", (the "Bartley-Myer patent"), and assigned to the assignee hereof and incorporated herein by reference and made a part hereof, there is disclosed microwave amplifying apparatus utilizing a cavity closure structure which encloses top and bottom circular microwave cavities. The upper side of the top cavity and the lower side of the bottom cavity are bounded by upper and lower rigid circular metal plates which are fastened together to be in axially spaced coaxial relation. The lower side of the top cavity and the upper side of the bottom cavity are, however, bounded over some or all of the area of the cavities by upper and lower sheet metal dishes which are axially spaced from each other and which, because made of sheet metal, are subject to flexure and lack the dimensional stability of the rigid plates in the presence of temperature variations, vibrations, and so on. While the flexibility of such sheet metal has not created an insuperable problem in the fabrication and use of the mentioned cavity closure structure according to the teaching of the Bartley-Myer patent, nonetheless, it has at times been difficult to attain the stability in the dimensioning of these cavities within the tolerances desired to be met.

SUMMARY OF THE INVENTION

That difficulty and other difficulties encountered in the fabrication and use of the microwave cavity closure structure and cavities disclosed in the Bartley-Myer patent are overcome by improvements which have been made according to the invention hereof in such closure structure, and cavities and which improvements are of the character set out by the appended claims.

BRIEF DESCRIPTION OF THE DRAWING

For a better understanding of the above described and other aspects of the invention, reference is made to the following description of a representative embodiment thereof, and to the accompanying drawings wherein:

FIG. 7 is a front elevation in cross-section of the cavity closure structure of apparatus which is an embodiment over which the invention hereof is an improvement;

FIG. 11 is an elevational view in cross-section of one of the small bushings used in the FIG. 7 embodiment;

FIG. 12 is a bottom view of the FIG. 11 bushing;

FIG. 13 is an elevational view in cross section of one of the large bushings used in the FIG. 7 embodiment;

FIG. 15 is a fragmentary elevational view in cross-section, taken as indicated by the arrows 15—15 in FIG. 14 of details shown in FIG. 14;

Figure 1:
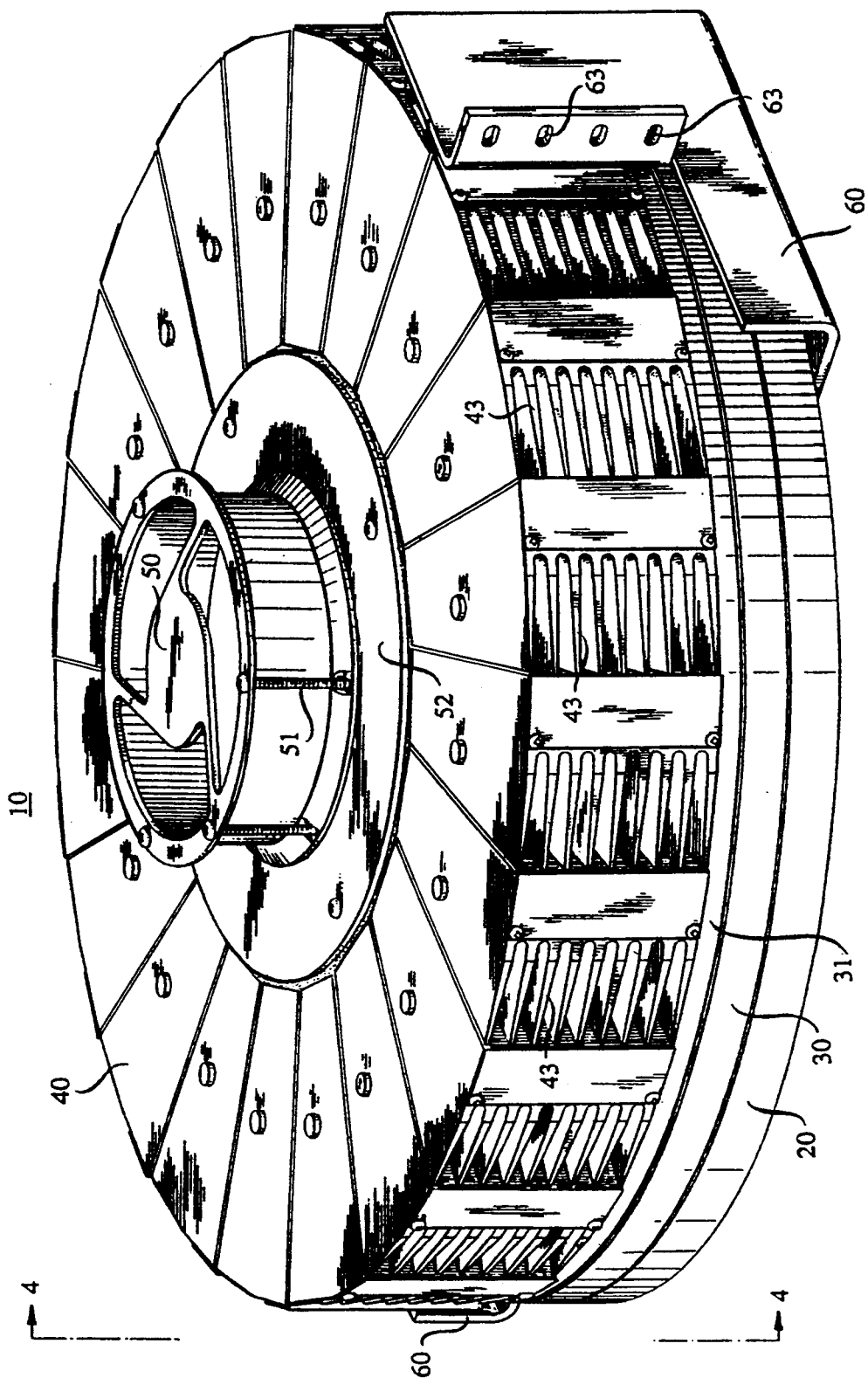
FIG. 1 is a perspective view of a microwave divider-combiner apparatus of a type to which the invention relates.

In the description which follows, certain elements which are counterparts of each other are designated by the same reference numeral with different alphabetical or numerical suffixes for those numerals to distinguish them from each other, and it is to be understood that a description of any such elements shall, unless the context otherwise indicates, be taken as equally applicable to all counterparts of that element.

DETAILED DESCRIPTION OF EMBODIMENT

FIG. 1 is a perspective view of an assembled apparatus in the form of a power amplifier generally denoted as 10 in a which radial power divider cavity 30 is stacked on radial power combiner cavity 20 so that both are axially aligned. It is to be understood, however, that other stacking arrangements may be used. For example, divider cavity 30 may be placed beneath combiner cavity 20 so that the input and output connections of the amplifier structure are reversed. Amplifier 10 as shown is operative over the frequency range between 869 MHz and 896 MHz used in cellular telephone systems. It is to be understood however that the dimensions and shape of amplifier 10 may be adapted to operate over other frequency ranges. Wedge shaped amplifier modules 40 are disposed in radial fashion around the outer portion of the top cover plate 31 of radial .power divider cavity 30. Each amplifier structure 40 includes a set of horizontal wedge shaped cooling fins 43 extending from each housing structure 40. Power supply connections to the amplifier device modules are not shown but can be readily placed on the top end of the amplifier device modules. Fan housing 50 is mounted above the central portion of divider cavity 30 on ring shaped plate 52. The fan in housing 50 forces ambient air across the horizontal fins 43 to remove heat from amplifier structures 40. As is readily seen, insertion and removal of amplifier housings 40 is completely independent of the air flow arrangements. Brackets 60 arranged on two sides of power amplifier 10 are attached to the bottom of combiner cavity 20 and have mounting holes 63 for attachment of amplifier assembly 10 to a frame not shown. While bracket mounting structures are shown in FIG. 1, it is to be understood that other mounting structures well known in the art may be used.

Figure 2:
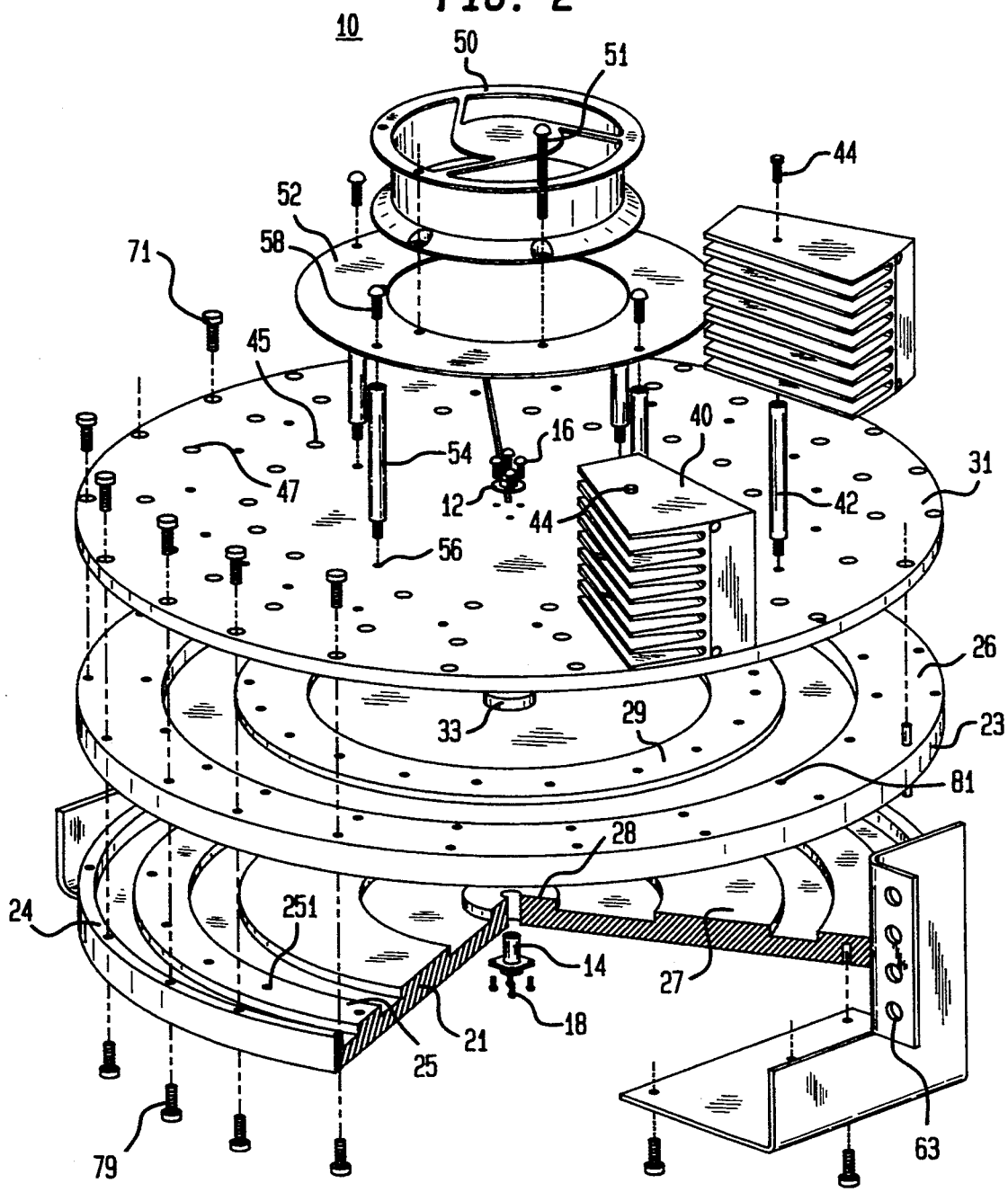
FIG. 2 is an exploded view of the apparatus shown in FIG. 1.

FIG. 2 is an exploded perspective view of amplifier structure 10. As shown in FIG. 2, combiner cavity 20 comprises circular bottom plate 21, the lower side of circular central plate 23 and outer cylindrical wall 24 extending peripherally upward from plate 21. The lower side of plate 23 is flat while the upper side of plate 21 includes a series of concentric ridges 25, 27 and 28. The ridges and valleys between plates 21 and 23 provide the electrical characteristics of combiner cavity 20. In particular, the narrow regions in the cavity formed between the ridges of circular plate 21 and the bottom of plate 23 correspond to capacitive elements while the wider regions in the cavity in between the ridges of plate 21 correspond to inductive elements. Similarly, divider cavity 30 comprises the upper side of circular plate 23, the lower side of flat circular cover plate 31 and outer cylindrical wall 26 extending upward from plate 23. Ridges 29 and 33 on the upper portion of plate 23 correspond to capacitive elements so that the prescribed electrical transmission characteristics are obtained. Although central plate 23 serves as the upper closure plate of cavity 20 and the lower closure plate of cavity 30, it is to be understood that the plate structure between the two cavities may comprise two separate elements as will be later described in more detail.

Circular plates 21, 23 and 31 are axially aligned and have the same diameter. Plate 31 is secured to the upper side of plate 23 by bolts 71 threaded into outer cylindrical wall 26 of plate 23 so that divider cavity 30 is formed. Plate 21 is secured to the lower side of plate 23 by threading bolts 79 into the periphery of plate 23 through outer cylindrical wall 24 of plate 21 whereby combiner cavity 20 is formed. Upper plate 31 of the divider cavity includes a set of apertures 45 arranged in a circular pattern for insertion of the input coaxial connector units of amplifying device modules 40 and a set of apertures 47 arranged in a circular pattern for insertion of the output coaxial connector units of amplifying device modules 40. Apertures 45 are circularly disposed at a first radial distance from a central port for plate 31 and apertures 47 are circularly disposed at a second radial distance greater than the first distance from such central port. While shown as having the second distance greater than the first distance, it is to be understood that the second distance may be smaller than the first distance so that input termination apertures are at a greater distance from the plate center than the output termination apertures.

Each aperture 45 is lined up radially with a corresponding aperture 47 for placement of one amplifying device module 40 on top of cover plate 31. While in position on upper plate 31, each amplifying device module 40 is secured thereto by a rod 42 passing through its horizontal fin structure 43 into plate 31 and bolt 44 threaded into the top of rod 42. Fan structure 50 is mounted on plate 52 by bolts 51 and is spaced from the upper surface of plate 31 by rods 54. These rods are threaded into apertures 56 in plate 31. Plate 52 is secured to the rods by bolts 58. The mounting of the amplifying device modules on plate 31 permits an efficient and economical heat transfer structure for the amplifier while permitting easy insertion and removal of individual modules.

A signal to be amplified is applied to input coaxial connection device 12 in FIG. 2 which is affixed to the central port of divider cavity plate 31 by bolts 16. Coaxial connection device 14, attached to the central port of plate 21 of combiner cavity 20 by bolts 18, is adapted to transfer the combined amplified signals to a load.

Figure 4:
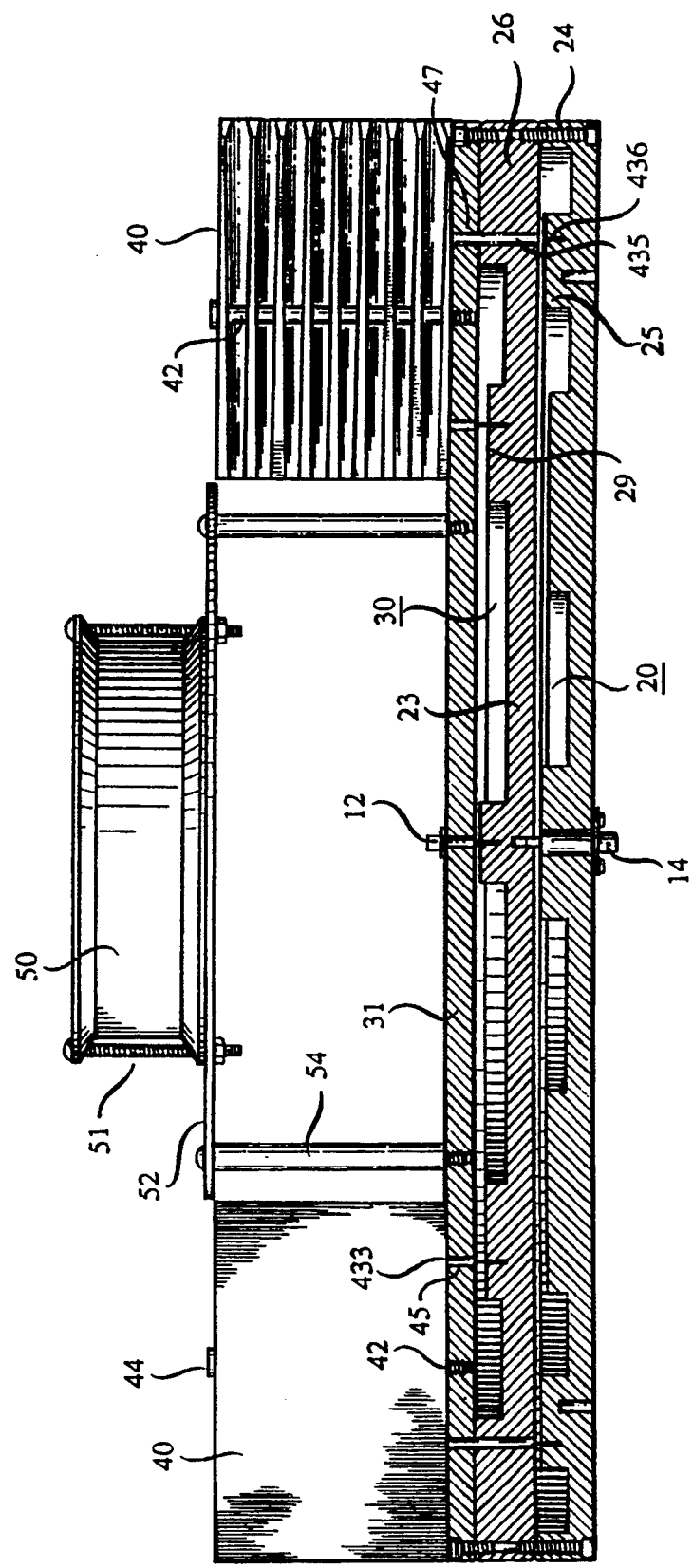
FIG. 4 is an elevation view of the apparatus of FIG. 1 through section 4—4 showing the interconnections between the power divider cavity, the amplifying device module and the power combiner cavity.

FIG. 4 depicts a cross section of amplifier structure 10 including amplifying device modules 40, divider cavity 30 and combiner cavity 20 along lines 4—4 in FIG. 1. Referring to FIG. 4, input signal energy enters the central port of divider cavity 30 through connection 12 in plate 31 and flows radially outward. Each amplifying device 40 has a coaxial input coupler 433 extending into divider cavity 30 through aperture 45. The outer conductor of coaxial input coupler 433 is in slidable contact with aperture 45 in plate 31 but does not extend into cavity 30. The center conductor of coupler 433 extends through cavity 30 and is in contact with the upper side of plate 23.

Amplifying device 40 may comprise a semiconductor circuit such as described in "Microwave Transistor Amplifiers Design and Analysis" by Guillermo Gonzalez, Prentice Hall, Inc., Englewood Cliffs, N.J. 1984. The output signal of amplifying device 40 appears on coaxial output coupler 435. The outer conductor of coupler 435 extends through aperture 47 and through a passageway in outer wall 26 of cavity 30 and plate 23 aligned therewith so that center conductor 436 of output coupler 435 passes through cavity 20 and contacts ridge 25. Combiner cavity 20 receives the output signal energy of each amplifying device 40 at ridge 25. The signal energy received by the combiner cavity from amplifying devices 40 flows radially inward toward coaxial connection device 14 which may be connected to a load such as an antenna via a cable not shown.

Figure 3:
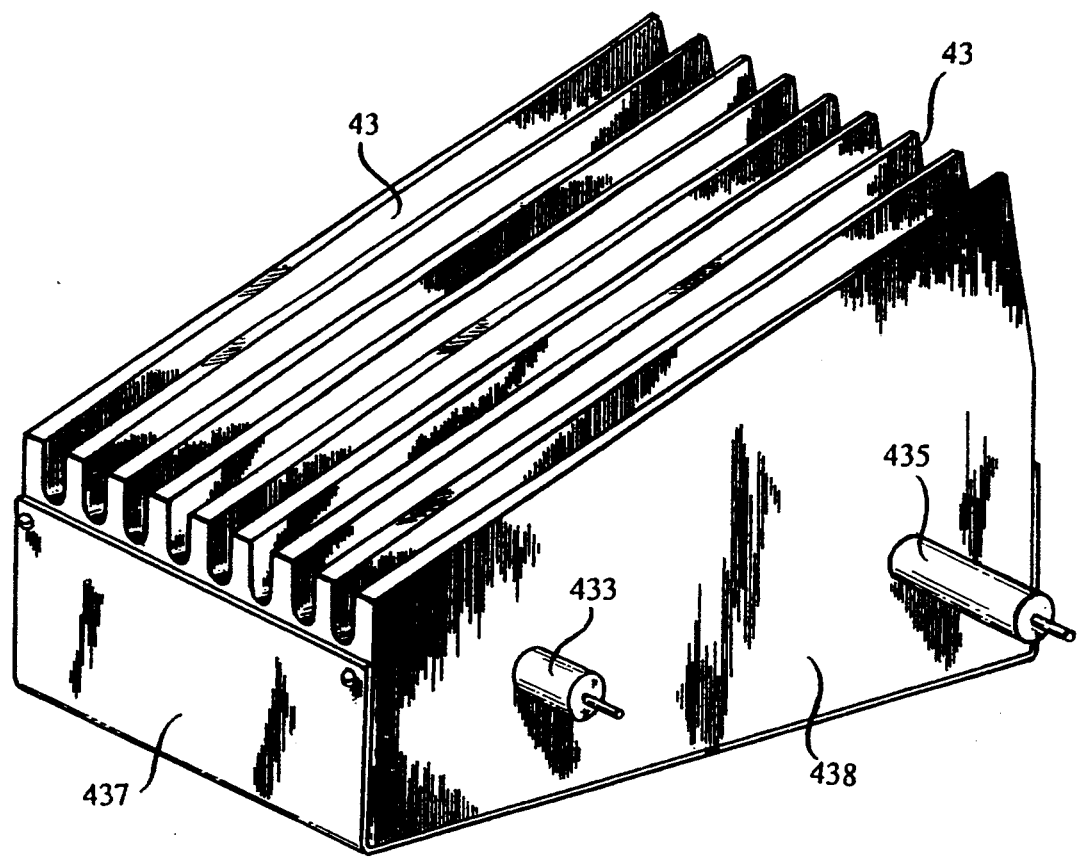
FIG. 3 is a perspective view of the housing of an amplifying device module of FIG. 1.

The wedge shaped housing structure of amplifying device module 40 is shown in greater detail in FIG. 3. Referring to FIG. 3, the electronic components comprising the amplifying device are contained in the interior of the housing within the width of side 437 while fins 43 extend from one side of the housing. Side 438 of the housing which is adapted to be placed on plate 31 as shown in FIG. 2 includes mounting arrangements for input coaxial extension 433 and output coaxial extension 435. Coaxial extension 433 is connected to the input of the amplifying device and coaxial extension 435 is connected to the output of the amplifying device. Coaxial couplers 433 and 435 both extend from one side of the housing and are spaced to fit into the corresponding set of apertures 45 and 47, respectively, along a radial line in FIG. 1. In FIG. 4 the closure structure for divider cavity 30 has the same outside diameter as the closure structure for combiner cavity 20 but its outer peripheral closure wall 26 is thicker than the peripheral closure wall beneath it for the combiner cavity 20. Input coupler 433 is relatively short so that it is slidably insertable into divider cavity 30 via an aperture 45, and output coupler 435 is relatively long so that it extends through the passageway including the corresponding aperture 47 in plate 31, outer cylindrical wall 26 of cavity 30 and plate 23 into cavity 20.

Coupler 433 is located closer to the narrow edge of side 438 (FIG. 3) and is inserted into an aperture 45 in the outer portion of divider cavity 30 while coupler 435 is located nearer the wider edge of side 438 so that it is inserted into aperture 47 and through the outer cylindrical wall of cavity 30 into the outer portion of combiner cavity 20. As aforementioned, the positions of couplers 433 and 435 may be reversed where more convenient. The center conductor of input coupler 433 extends through divider cavity 30 to receive signal energy therefrom while the outer conductor of input coupler 433 slides into aperture 45 but does not protrude into the divider cavity. The outer conductor of output coupler 435 extends through the cylindrical wall of plate 31 of divider cavity 30 into cylindrical wall 26 of plate 23 but does not extend into cavity 20. The center conductor of coupler 435 passes through cavity 20 at ridge 25 to provide efficient signal coupling into the combiner cavity. It is to be understood that other arrangements for entering combiner cavity 20 may be used which will be later described in more detail.

The structures of coaxial connector units 433 and 435 and the particular details of such structures may be as disclosed in U.S. Pat. No. 4,967,168 issued Oct. 30, 1990 in the name of E. V. Bacher and R. E. Myer for "Coaxial Wave Guide Coupling Assemblages", such patent being assigned to the assignee hereof and being incorporated herein by reference and made a part hereof.

Amplifying device 40 is mounted on plate 31 of divider cavity 30 by holding device 40 in a raised position over that plate and aligning the input and output couplers along the radial line through the pair of apertures 45 and 47 therealong. Input coupler 433 is placed above aperture 45 and output coupler 435 is placed above aperture 47. A guide rod 42 has previously been threaded into plate 31 to stand upright therefrom, and device 40 in its raised position is disposed above that rod. The amplifying device is slid from such raised position down on rod 42 such that the rod passes relatively upwards through receptacle holes therefor in the amplifier fins 43. The device 40 is then secured by tightening nut 44 onto the threaded top section of the rod 42. Amplifying device removal is accomplished by reversing these steps.

Figure 5:
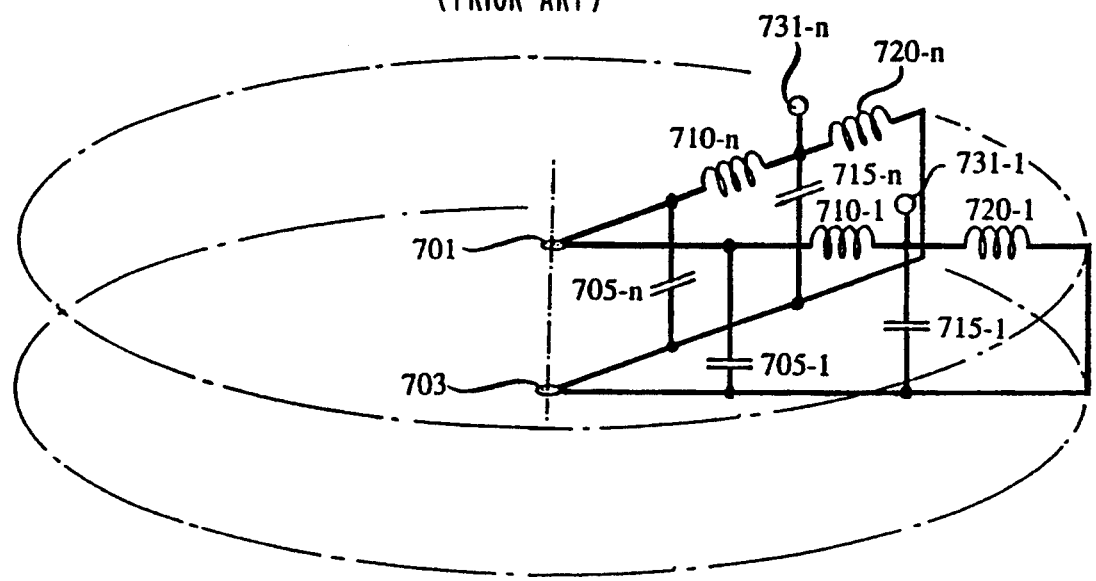
FIG. 5 is a circuit diagram showing an electrical equivalent circuit illustrating the effect of the divider cavity of FIG. 1.

FIG. 5 shows an electrical equivalent circuit for divider cavity 30 in which the narrow sections in the cavity above the ridges in plate 23 are represented as capacitor elements and the wide sections intermediate the ridges are represented as inductive elements. As illustrated in FIG. 5, the input signal is applied to points 701 and 703 which correspond to the center of the cavity through input connection 12 (FIG. 2). The signal energy spreads as it travels radially outward so that a portion of the energy is available to each amplifying device input coupler. An input coaxial coupler is connected to point 731-1 for one amplifying device. Another input coaxial coupler is connected to point 731-n and couplers are connected to points 731-2 through 731-n-1 for amplifying devices therebetween with networks not shown. For n amplifying devices each with an input impedance of 50 ohms, the resulting impedance of the n units connected in parallel is 50/n ohms. The ridge arrangement of cavity 30 between the lower portion of plate 31 and the upper portion of plate 23 provides an impedance network well known in the art so that a load impedance of 50 ohms is presented between points 701 and 703 to connection 12 and a source impedance of 50 ohms is presented to each amplifying device at its input point 731-n in the frequency range of interest.

The equivalent circuit for one amplifying device, in cavity 30 shown in FIG. 5, comprises capacitors 705-1 and 715-1 corresponding to ridges 33 and 29 in FIGS. 2 and 4 and inductances 710-1 and 720-1 corresponding to the valley portions between these ridges.

Figure 6:
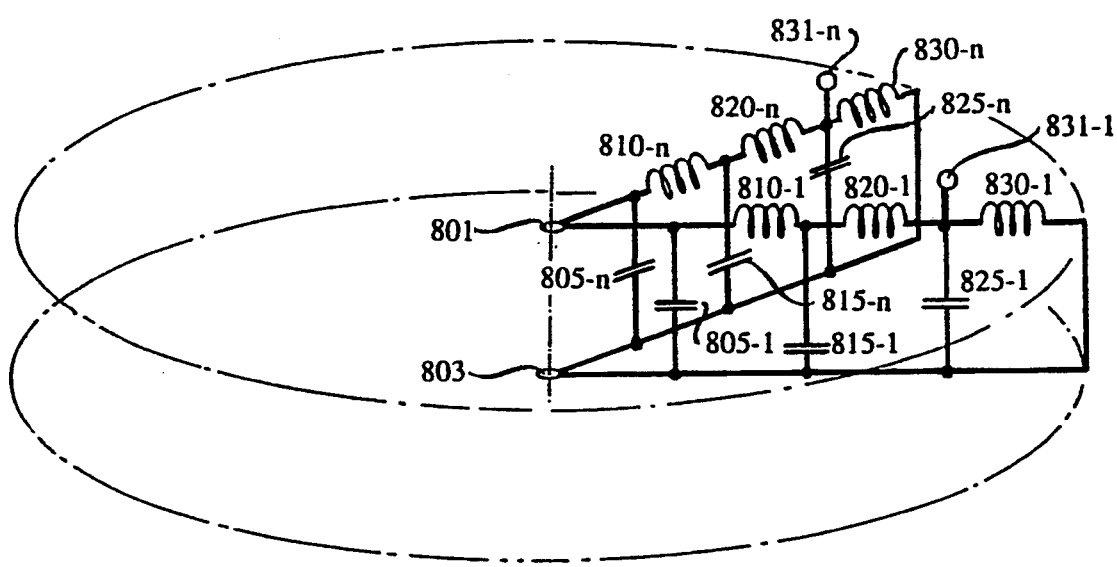
FIG. 6 is a circuit diagram showing an electrical equivalent circuit illustrating the effect of the combiner cavity of FIG. 1.

FIG. 6 shows an electrical equivalent circuit for combiner cavity 20 which combines the amplified signal energy from the amplifying device output couplers. The output of amplifying devices 40 are applied to points 831-1 through 831-n, respectively. These points correspond to apertures 47 on the outer portion of the stacked cavities. An output coupler is connected to point 831-1. Another output coupler is connected to point 831-n and couplers are connected to similar points for amplifying devices therebetween with networks not shown. For n amplifying devices each with an output impedance of 50 ohms, the resulting impedance of the amplifying device outputs connected in parallel absent the combiner cavity is 50/n ohms. The ridge arrangement between the lower portion of plate 23 and the upper portion of plate 21 provides an impedance matching network so that a source impedance of 50 ohms is presented between points 801 and 803 to output connection 14 and a load impedance of 50 ohms is presented to each amplifying device at its input point 831-n. The equivalent circuit for one amplifying device, in cavity 20 shown in FIG. 8, comprises capacitors 805-1, 815-1 and 825-1 corresponding to portions of ridges 28, 27, and 25 and inductances 810-1, 820-1 and 830-1 corresponding to the valleys between these ridges. For another amplifying device, capacitors 805-n, 815-n, and 825-n and inductors 810-n, 820-n and 830-n are formed from the associated portions of the ridges and valleys therebetween.

The number of amplifying devices inserted into the divider and combiner cavities may vary from one to the number required to fill the outer portion of plate 31. The parameters of the divider and combiner cavities, however, are fixed for a prescribed number of amplifying devices. In the event that fewer devices are inserted, there is an impedance mismatch at the input and output ports of the radial cavities. While the mismatch at the input port of divider cavity causes little variation in the amplifier gain over the desired frequency range, the mismatch at the output port is significant. An impedance matching stub well known in the art at the output port such as ¼ wave stub 17 in FIG. 4 may be used to compensate for such output port mismatch. The parameters of the stub are a function of the number of amplifying devices used. For example, if half of the amplifying devices are plugged into the divider and combiner cavities, a matching stub of 70.7 Ω is required.

Figure 8:
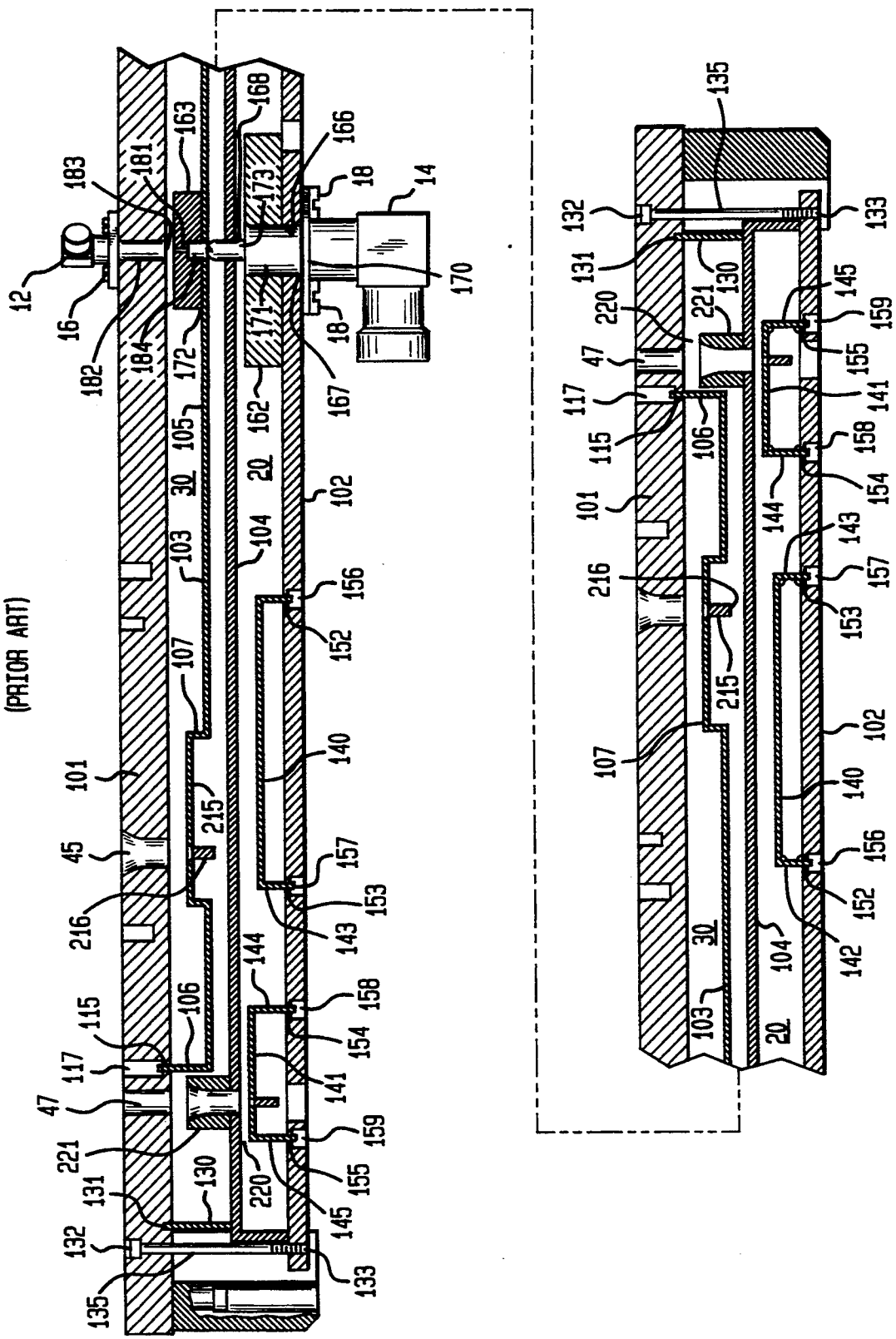
FIG. 8 is an enlarged front elevation view in cross-section of a part of the FIG. 7 embodiment.

FIGS. 7 and 8 show the cavity closure means and associated details of splitter-combiner microwave amplifying apparatus according to the present invention. Referring to these figures, such closure means comprises a top wall means on the upper side of divider cavity 30 and in the form of a relatively thick rigid horizontal metallic plate 101 of constant thickness and having a flat undersurface bounding that cavity. Plate 101 is constituted of aluminum. A bottom wall means for the mentioned closure means is provided by a horizontal aluminum plate 102 with similar characteristics to plate 101. The upper and lower cavities 30 and 20 are separated by central wall means in the form of upper and lower relatively thin and somewhat flexible annular horizontal dishes 103, 104 vertically spaced from each other by a small gap 105 and constituted of aluminum sheet metal. Dishes 103 and 104 bound the lower and upper sides of, respectively, the upper divider or splitter cavity 30 and the lower combiner cavity 20.

The sheet metal of dish 103 is inflected at the circumferential margin of the dish to form therefor a circular peripheral flange 106 upstanding from the relatively flat central panel portion of the dish and substantially at a right angle to that panel portion and defining the periphery of upper splitter cavity 30. Radially inwards of flange 106, the sheet metal of dish 103 is inflected to form an alternation, facing toward upper cavity 30, of an annular ridge 107 and radially outer and inner valleys 108 and 109 on radially opposite sides of the ridge 107.

The dish 103 is coupled to the plate 101 in a manner as follows. Plate 101 has formed in its underside an angularly continuous annular groove 115 (FIGS. 14 and 15) coaxial with the axis of cavities 30 and 20 and extending from the bottom surface 114 of plate 101 vertically upward for a short distance to terminate at a top 116 for the groove. Distributed equiangularly along the center line of groove 115 are a set of twenty circular access holes 117 (FIGS. 14 and 15) extending from the top surface of plate down into the plate to intersect with groove 115 and to terminate at bottoms 118 which provide blind ends for such holes, and which bottoms are vertically located below the groove top 116. The holes 117 are of greater diameter than the radial width of groove 115 so that such holes extend to either radial side of the groove.

Figure 14:
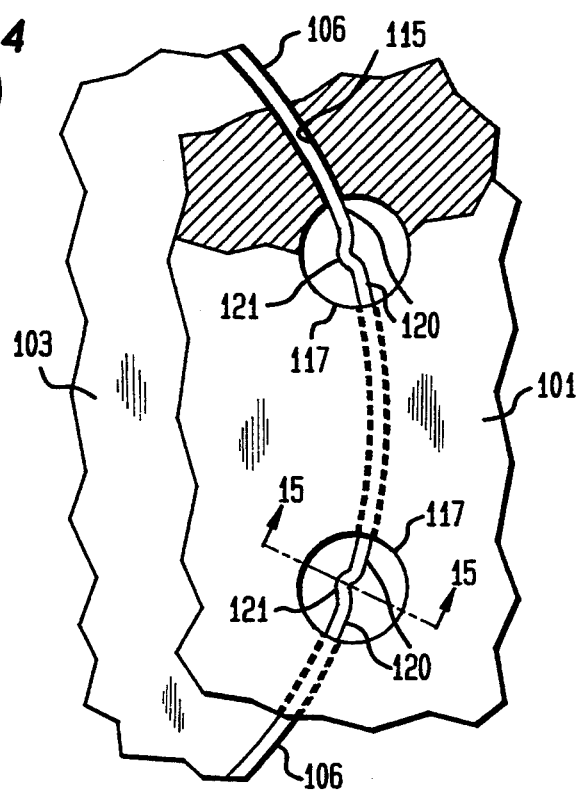
FIG. 14 is an enlarged broken away plan view, taken as indicated by the arrows 14—14 in FIG. 7, of the top plate of the FIG. 7 embodiment and related details.

The groove 115 has seated therein the rim 120 of the peripheral flange 106 of the aluminum dish 103. To fasten that dish to plate 101, the plate is rested on the dish so that the rim 120 of the dish's flange 106 contacts the top 116 of groove 115 all around that groove. There is then inserted into each of holes 117 in turn a bending tool (not shown) having a downward facing slot in its lower end. The tool is positioned in that hole so that the portion of flange rim 120 in such hole is received with such slot. The tool is next forcibly turned within the hole to twist the rim portion in the tool slot so as to bend such portion into an angulation 121 located above the bottom 118 of the hole. FIG. 15 shows the flange rim 120 in a hole 117 before such angulation is formed in the rim. FIG. 14 in contrast shows such rim after angulations have been formed in it. These angulations serve to anchor dish 103 firmly to plate 101.

The aluminum material of the flange rim 120 is sufficiently ductile that its bending, as described, in holes 117 does not break the rim. The milling of plate 101 required to form groove 115 is minimal. The twisting as described in holes 117 of the flange rim creates stresses in flange 106 producing a forcible drawing together of the plate 101 and dish 103. That forcible drawing together causes, first, a durable fixing of the relative horizontal positioning of the plate and dish and, secondly, good electromechanical contact therebetween all around the flange to thereby avoid or reduce the creation of electrical discontinuities at the metallic wall surfaces bounding cavity 20. Moreover the described mode of coupling of the plate and dish conserves the radial space needed to be occupied by the dish in that it does not require any radially extending horizontal flange in order to fasten the dish to the plate by bolts passing through such flange.

Turning now to the lower circular sheet metal dish 104, the sheet metal thereof is inflected at the circumference of the dish to form a circular peripheral flange 125 downstanding from the flat central panel of the dish and defining the periphery of lower combiner cavity 20. The lower rim of flange 125 merely rests on the upper surface of the lower plate 102 to be slidable on that flat horizontal surface. That is, at a stage in the fabrication of the cavity closure assembly shown in FIG. 7, the dish 104 and plate 102 are freely adjustable in their relative horizontal positioning.

Disposed vertically between dish 104 and plate 101 is an annular spacer collar 130 having its upper end seated in an annular groove 131 formed in the underside of plate 102. The lower end of collar 130 rests on the flat horizontal top of dish 104 to be slidable thereon. The spacer collar 130 may conveniently be provided by a band of aluminum bent into a circle to form a split ring.

Radially outward of groove 131, the upper plate 101 is pierced by a set of equiangularly distributed vertical unthreaded holes 132 vertically registering with a corresponding set of unthreaded vertical holes 133 formed the lower plate 102 to form pairs of aligned holes 132, 133. Each such pair of holes is adapted to receive one of a set of clamping bolts 135 (FIGS. 8 and 9) passing through the top hole of the pair and into its bottom hole to threadedly engage the plate 102. By proper turning of the bolts 135, the plates 101 are drawn together to cause spacer collar 130 to transmit force downward to dish 104 to press the flange 125 of that dish hard against the top of plate 102 to thereby clamp the dish and plate together in their relative horizontal positioning existing at the time. Concurrently, the drawing together of plates 101, 102 by bolts 135 and the action of collar 130 on dish 104 serves to fix the size of the gap 105 between the dishes 103, 104 as a function of the vertical dimension of that ring. That gap size is not critical so long as it is great enough to permit tuning through an appropriate range of the cavities 30 and 20 as later described.

The lower plate 102 is shown in FIG. 7 as bearing on its upper side a plurality of concentric annular sheet metal tings 140 and 141. The sheet metal of ring 140 is bent at each of its radially opposite margins to form circular peripheral flanges 142, 143 downstanding from the central panel of that ring. Similarly, the sheet metal of ring 141 is bent to form circular peripheral flanges 144, 145 downstanding from the central panel of the latter ring.

The peripheral flanges 142, 143, 144, 145 of the rings 140, 141 are seated in respectively corresponding annular grooves 152, 153, 154, 155 extending for a short distance down into plate 102 from its upper side. The grooves 152, 153, 154, 155 have equiangularly distributed therearound, along their centerlines, respective sets of vertical access holes 156, 157, 158, 159. Each of those holes extends from the undersurface of plate 102 vertically upward to intersect with the associated groove, and to terminate in a blind end disposed upwards of the bottom of such downwardly extending groove. In general, the arrangements of grooves and access holes provided by the elements 152-155, 156-159 for affixing the sheet metal flanges 142-145 to plate 102 is the same as the arrangement described above of groove 115 and tool access holes 117 for affixing the sheet metal flange 106 to plate 101. A difference is that such arrangements for affixing the flanges 142-145 are "upside down" in relation to the arrangement for affixing the flange 106. Taking that difference into account, however, the foregoing description of how flange 106 is fastened to plate 101 by using a tool inserted into the access holes to form angulations in the rim portions in such holes of the flange is a description which is equally applicable to the technique by which flanges 142-145 are affixed to plate 102 by using a bending tool to form angulations in the holes 156-159 of the rim portions therein of the flanges therein. By virtue of the use of such technique, the sheet metal rings 140, 141 forcibly drawn together with plate 102 to be firmly fixed in their positioning relative thereto and to make good electromechanical contact therewith all around the flanges 142-145. A result of such good contact is that there is avoided or reduced the creation of electrical discontinuities in the metallic wall surfaces bounding the lower combiner cavity 20. From what has been said, it will be evident that the rings 140, 141 form on plate 102 a plurality of annular hollow bosses projecting into cavity 20. Such plate and rings together serve to bound cavity 20 on its lower side by a metallic composite wall surface comprising surface portions of both said plate and said rings and having therein an alternation of ridges and valleys concentric with each other and facing toward that cavity.

Figure 9:
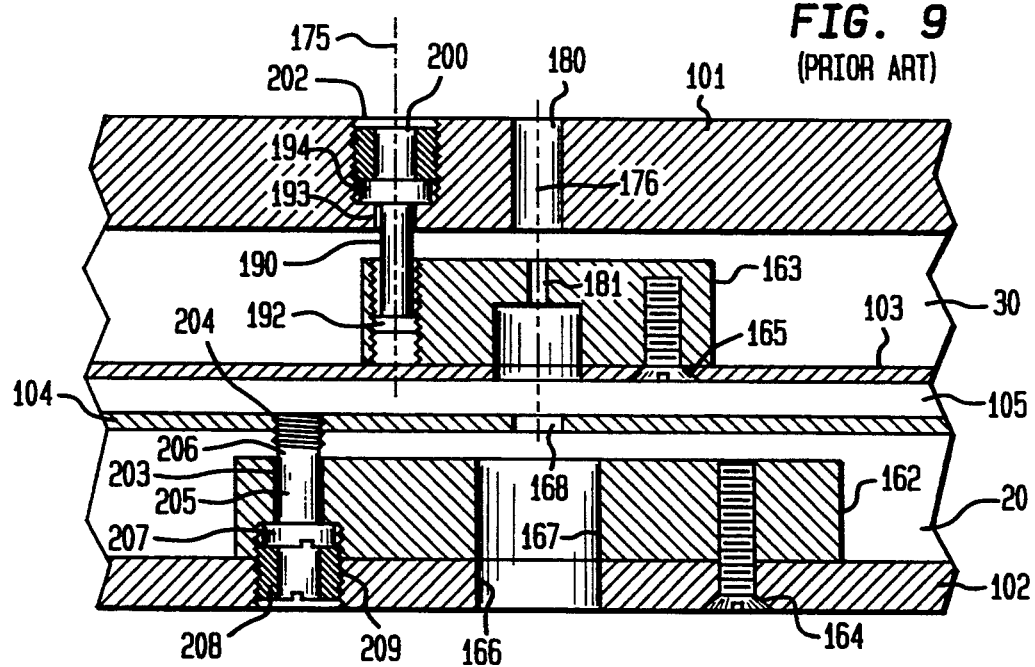
FIG. 9 is a fragmentary enlarged right side elevation in cross-section of the central portion of the FIG. 7 embodiment, the view of FIG. 9 being at a right angle, to the FIG. 7 view.

Referring now to FIG. 9 as well as FIGS. 7 and 8, the plate 102 and dish 103 on their upper sides have thereon respective relatively thick solid aluminum circular disks 162, 163 disposed radially at the respective centers of such plate and dish and fastened thereto by respective sets of bolts 164, 154 equiangularly distributed around the axes of the disk 162 and the disk 163. Disk 162 forms on plate 102 a central circular boss coaxial with the bosses formed thereon by sheet metal rings 140, 141 (FIG. 7) so as to add another "ridge" to the alternation of ridges and valleys characterizing the composite wall surface for cavity 20 provided by such rings and underlying plate 102. Similarly disc 163 is coaxial with the annular ridge 107 formed in the plate 103 by bending of its sheet metal so as to add another "ridge" to the alternation pattern of ridges and valleys for the metallic wall surface bounding the lower side of cavity 30.

Plate 102 has formed therein (FIG. 9) a vertical bore 166 coaxial with a similar diameter bore 167 formed in plate 162 and another vertical bore 168 of much smaller diameter formed in dish 104 across the cavity 20 from disc 162. The bores 166, 167, 168 have received therein different parts of the coaxial connection device 14 fastened to the cavity closure structure by bolts 18 (FIG. 8). Device 14 may be a coaxial connector of the type which is described in U.S. patent application Ser. No. 07/473,770 entitled "Coaxial Wave Guide Assemblages", filed Feb. 2, 1990 in the name of James N. Martin, and assigned to the assignee hereof, such application being incorporated herein by reference and made a part hereof. Device 14 comprises (FIG. 8) a metal base 170 fastened to plate 102 by bolts 18, a dielectric sleeve 171 projecting from such base into and through bores 166, 167 and a pin 172 serving as a coaxial inner conductor and passing coaxially upward through sleeve 171 and beyond it to a tapered tip 173 partly received in bore 168. As described in the patent application just mentioned, pin 172 below tip 173 is of somewhat greater diameter than bore 168, and the tip 173 is resiliently radially compressible.

Turning to the upper plate, 101 (FIG. 9), that plate has formed in it a vertical bore 180 coaxial with a smaller vertical bore 181 formed in disc 163 coaxial with its axis and extending downward from its upper surface. Bores 180 and 181 serve as receptacles for different parts of the input coaxial connector device 12 (FIG. 8) fastened to plate 101 by bolts 16 and similar in structure to the device 14 described above. The inner conductor pin 182 of device 14 is of somewhat greater diameter than bore 181 and terminates in a radially resiliently compressible tapered tip 183 partly received in that bore and resiliently compressed by being introduced thereinto so as to make electromechanical contact under pressure with the disc 163. Bore 181 at its lower end is enlarged by a countersink 184 extending into disc 163 from its underside, and into which the upper end of the inner conductor tip 173 of coupler 14 may be received with a clearance all around permitting relative horizontal adjustment between dishes 103 and 104.

As best shown by FIGS. 9 and 102, the upper plate 101 is pierced by an unthreaded vertical hole 190 topped by a larger diameter threaded countersink 191 unthreaded hole 190 registers with a threaded vertical hole 192 in disc 163. An insulative cavity tuning screw 193 is inserted into holes 190 and 192 and, at its forward end, has threads engaging with the threads on the wall of hole 192 to produce a threaded coupling of the screw to disc 163 and, hence, to sheet metal dish 103. Screw 193 is made of a material having good dimensional stability with temperature change as, for example, without being limited to, the material G-10 epoxy glass. The screw 193 has a head 194 which contains a slot 195. Head 194 is seated on the bottom of countersink 191 and is of greater diameter than that of hole 190 so that the head cannot be forced down into that hole.

Received in threaded countersink 191 above screw head 194 is an annular plug 20 having a central cylindrical aperture 201 passing vertically therethrough, and having a threaded cylindrical external wall of which the threads engage these on the countersink to permit, by turning of the plug, on axial motion of the plug in either direction in countersink 191. To aid in that turning, the plug 200 has a slot 202 formed in its top.

Figure 10:
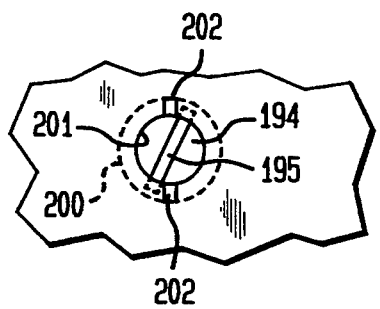
FIG. 10 is a fragmentary plan view of details shown in FIG. 9.

The elements 190–195, 200–202 constitute an arrangement for tuning the resonant frequency of divider cavity 30, as well be later described in more detail. The lower cavity 20 is adapted to be tuned by similar means comprising an insulative cavity tuning screw 205 having a threaded stem 206 passing upward through an unthreaded hole 203 in disc 162 into a threaded hole 204 in sheet metal dish to threadedly engage with that dish. Screw 205 has a head 207 seated in the bottom of a "countersink" bore 208 passing upward through plate 102 and disc 162 and having a threaded wall over its portions in the disc. Below screw head 207, the bore 208 contains an annular plug 209 threadedly engaging the wall of bore 208 in disc 162. In order to turn the screw 205 and the plug 209, the screw head 207 and the bottom of the plug have slots therein similar to the slots 195 and 202 in (FIG. 10) the screw head 194 and the plug 200.

Returning to FIGS. 7 and 8, the upper plate 101 is pierced by a set of relatively large diameter vertical bores 45 registering and coaxial with a set of corresponding holes 215 on the opposite side of cavity 30 and passing vertically through the ridge 107 of sheet metal dish 103. Press fitted into holes 215 to be affixed with dish 103 are a set of small hollow cylindrical bushings 216 having (FIGS. 11 and 12) vertical central passages 217 therethrough and heads 218 fittable into holes 215. The bushings 216 project from plate 103 away from cavity 30 instead of toward it so as to avoid the creation in such cavity of impedance anomalies caused by the presence of such bushings. The bushings 216 are, however, recessed in the hollow formed underneath ridge 107 so as to not extend into the gap 105 between dishes 103 and 104.

Each hole 45 in plate 101 is paired with a "small" bushing 216 on dish 103 to provide for each of the input coaxial connector units 433 for amplifiers 40 (FIG. 4) a pair of receptacles for containing therein different parts of that connector unit. More specifically, units 433 may, as earlier stated, be of the kind disclosed in U.S. Pat. No. 4,967,168 so as to comprise metallic coaxial inner and outer conductors, separated by dielectric material where axially coextensive, the inner conductor comprising a pin projecting forward of the outer conductor and terminating in a resiliently radially compressible tip. Each such unit is received in one of holes 45 and the paired bushing 216 so that the unit's outer conductor is in electromechanical contact with the wall of that hole 45. The inner pin conductor of such unit is of greater diameter above its tapered tip than the passage 217 in such bushing, and such tapered tip is only partly received in such passage and is resiliently compressed by entry into it so as to make electromechanical contact under pressure with the wall of such passage to thus be electrically coupled with dish 103.

The FIG. 7 embodiment further includes the holes 47 in plate 101 and a set of holes 220 disposed beneath holes 47 and shown in FIGS. 7–9 as formed in lower sheet metal dish 104. Press fitted into holes 220 are a set of "large" bushings 221 having (FIG. 13) vertical central passages 222 therethrough and bases 223 deformably fittable into holes 220. Bushings 221 project from dish 104 away from the cavity 20 bounded by that dish, and the "large" bushings 221 are paired with, and vertically register with, respectively corresponding "small" bushings 225 press fitted into holes in the sheet metal ring 141 on lower plate 102 to project from that ring in the direction away from the cavity 20 bounded by ring 141. Bushings 225 are similar to the "small" bushings 216 already described. Each hole 47, large bushing 221 underneath and its corresponding small bushing 225 provide respective receptacles for different parts of one of the output coaxial connector units 435 which (FIG. 4) extend from amplifiers 40 to the lower cavity 20, and which units 435 are longer than input units 433 described above but are otherwise similar in structure to the latter units. Each such unit 435 is received within a hole 47 and a paired large bushing 221 and associated small bushing 225 so that the outer coaxial conductor of the unit electromechanically contacts the walls of such hole and large bushing, and so that the resiliently radially compressible tip of the inner coaxial conductor pin is partly received in the passage in the small bushing and is compressed therein to make pressure electromechanical contact with bushing 225.

Use and Features of FIG.7 Apparatus

The embodiment of the invention constituting the described splitter-combiner apparatus incorporating the FIG. 7 cavity closure means is fabricated as follows. As described above sheet metal rings 140 and 141 are fastened to lower plate 102, sheet metal dish 103 is fastened to upper plate 101, and band 130 is inserted into groove 131 in that upper plate to form the spacer collar. Sheet metal dish 104 is then placed on plate 102 so that the flange 106 of the dish rests on the top surface of that plate. Next, the assembly of elements 101, 103 and 130 is placed over dish 104 so that such dish is contacted by the lower end of spacer collar 130. Plates 101, 102 and dish 104 are then adjusted in relative horizontal positioning so that the holes 47 in plate 101, the vertical passages 222 in large bushings 221 and the vertical passages in small bushings 225 are roughly in vertical alignment with each other. When such rough alignment has been achieved, precision dummy aligning pins (not shown) are passed through selected of the holes 47 and the passages in the large bushings 221 and small bushings 225 beneath those selected holes to produce a desired accurate relative horizontal positioning between the elements 101, 102 and 104. Such elements are then clamped in that accurate positioning by tightening bolts 133 to draw together plates 101 and 102.

An advantage in achieving fixed relative horizontal positioning as described between dish 104 and plates 101 and 102 is that accurate alignment of the large bushings 221 relative to the holes 47 and bushings 225 may be obtained merely by relatively accurately locating in dish 104 the bushing holes 220 without requiring as well that such holes also be accurately located relative to datum points on dish 104 which reference the location of that dish as a whole to datum points on plate 101 and/or plate 102.

With such clamping being completed, the amplifiers 40 are lowered one by one onto top plate 101 to pass the input coaxial couplers 433, through holes 45 and partly into bushings 206 and, concurrently, to pass the output coaxial couplers 435, through holes 47 and bushings 221 partly into bushings 225. When this is done various parts of the couplers 433 and 435 became electrically coupled by electromechanical contact with various parts of the cavity closure means as described above, and the assembling of the described splitter-combiner apparatus has been completed.

When such apparatus is operating, the cavity 30 is tuned to a desired resonant frequency by using a screwdriver or other tool to back off plug 200 in countersink 191 just enough (FIGS. 9 and 10) to permit turning of screw 193 while concurrently retaining that screw substantially fixed in axial position relative to plate 101. Screw 193 is then turned by a screwdriver inserted into the central aperture of plug 200. The turning of screw 193 operates through the threaded engagement of the screw with disc 163 to positively displace the radially central panel of flexible dish 103 either towards or away from plate 101 (across cavity 30 from dish 103), in dependence on the direction of angular turning of screw 193, so as, thereby, to vary the resonant frequency of cavity 30 until it corresponds to a desired frequency value. Once cavity 30 has been so tuned, plug 200 is tightened down on screw 193 to fix its angular position to thereby keep the cavity resonant at that desired frequency.

The ability to positively displace the central part of dish 103 in either axial direction by moving screw 193 in one or the other of its two angular directions of turning is advantageous because it avoids the necessity of having in gap 105 a compression spring, or the like, operating upon retraction of the screw to displace the dish in the axial direction toward plate 101, the screw itself acting to displace the dish in the other axial direction. Because, however, gap 105 need not be designed to contain such a spring or the like, the vertical dimension of the gap may be reduced to no more than that necessary to enable tuning over the frequency ranges desired of the resonant frequencies of cavities 30 and 20 to thereby make more compact in the vertical dimension the described splitter-combiner apparatus.

The use of screw 193 or like means adapted to positively displace the center part of flexible dish 103 in either axial direction is also advantageous because the screw, when stopped at its desired setting, locks such center part against further displacement in either axial direction to thereby contribute to the dimensional stability of the configuration of the dish.

Plug 209 and insulative screw 205 may be used to tune the resonant frequency of cavity 20 entirely independently of the tuning of cavity 30. The manner in which such plug and screw are manipulated to effect such tuning of cavity 20 will be self evident from the description just given of the manner of tuning cavity 30 by screw 193 and plug 200.

In the splitter-combiner apparatus having the cavity closure means shown by FIG. 7, the inner coaxial conductors of the output coaxial couplers 435 435 435 435 inserted into holes 47 need only be long enough to reach the bushings 225 disposed on the top of the composite wall means provided by plate 102 and sheet metal rings 140, 141. That is, such inner coaxial conductors need not be large enough to reach the plate 102 itself. Accordingly the composite structure of plate 102 and tings 140, 141 affords the advantage of being able to use shorter output couplers than are needed for, say, the FIG. 6 embodiment of the mentioned Myers 18 application while, at the same time avoiding most of the milling expense incident to the extensively milled plates of the cavity closure means disclosed in the '400 patent.

The use of bushings press fitted into holes in the sheet metal dishes 103, 104 and the sheet metal tings 140, 141 improves the reliability of the electrical coupling between the coaxial coupler units 433, 435 and the sheet metal elements with which such coupling is made. None of such bushings project into either of cavities 20 and 30 so as to possibly create impedance anomalies in such cavities. Moreover, none of such bushings project into the gap 105 between sheet metal dishes 103, 104 so as to necessitate an undesirable increase in the vertical size of such gap.

Figure 16:
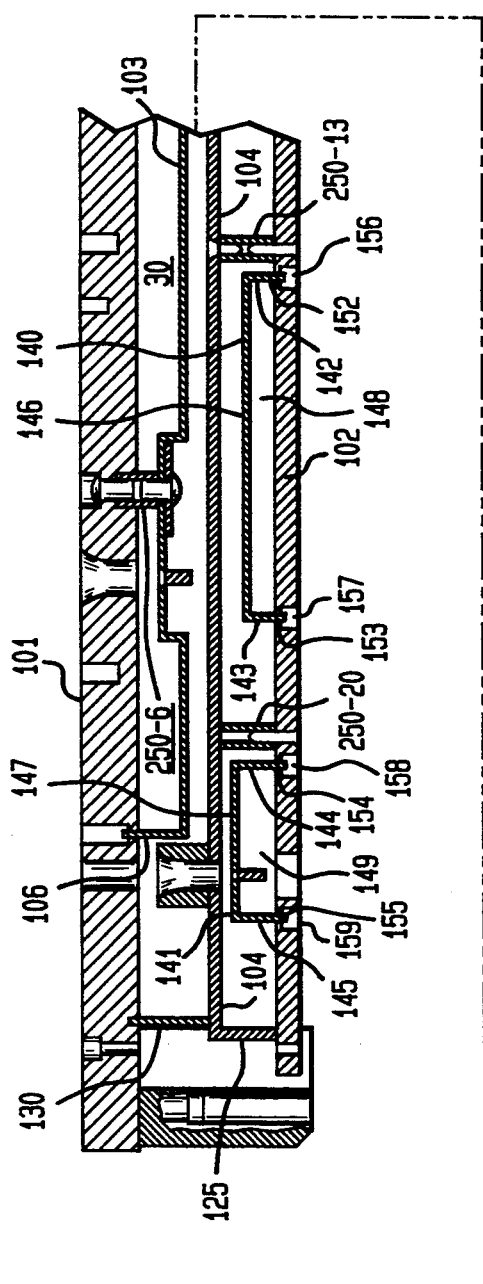
FIG. 16 is a front elevation in cross-section of a modification of the FIG. 7 embodiment, which modification incorporates exemplary improvements according to the invention hereof.
Figure 16:
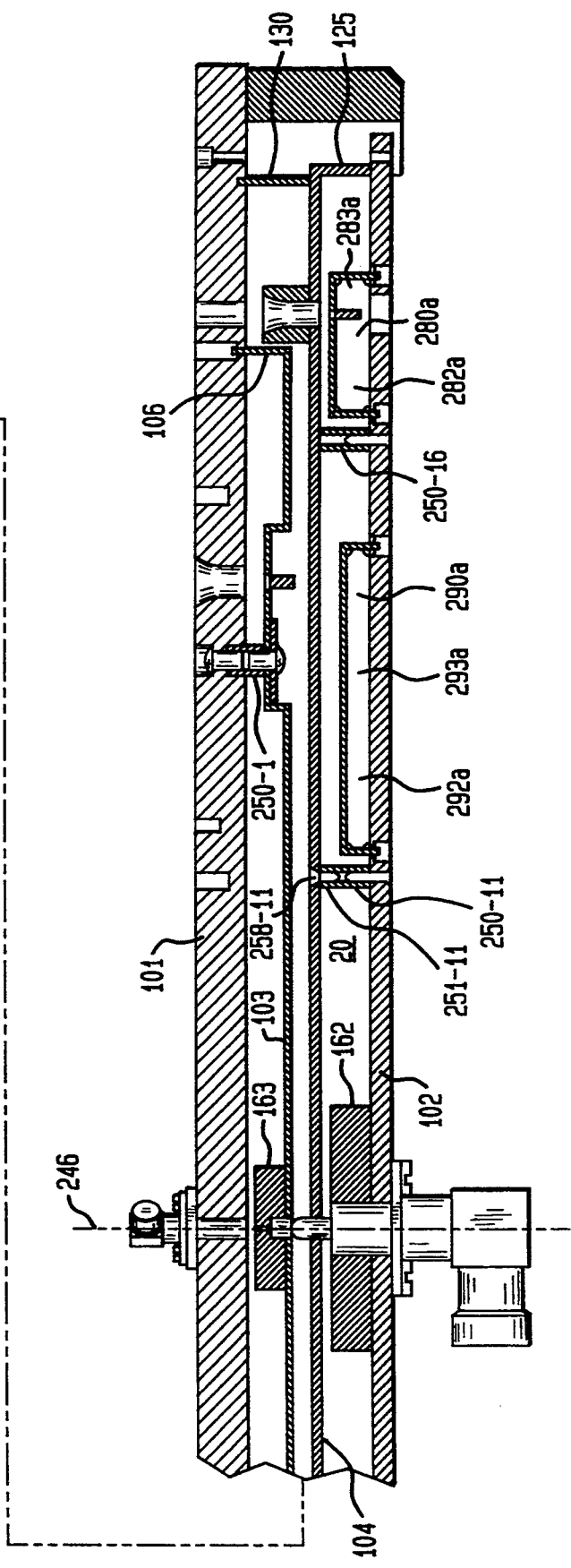

Reference is now made to the microwave cavity closure means which is shown by FIG. 16 and is a modification of, and includes improvements, over the FIG. 7 microwave cavity closure means. The FIG. 16 closure means is an exemplary embodiment of the present invention.

Figure 18:
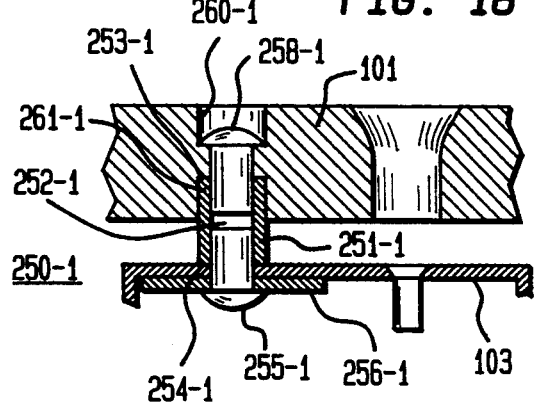
FIG. 18 is an enlarged view in cross-section of one of the dielectric spacers used in the FIG. 16 embodiment.
Figure 19:
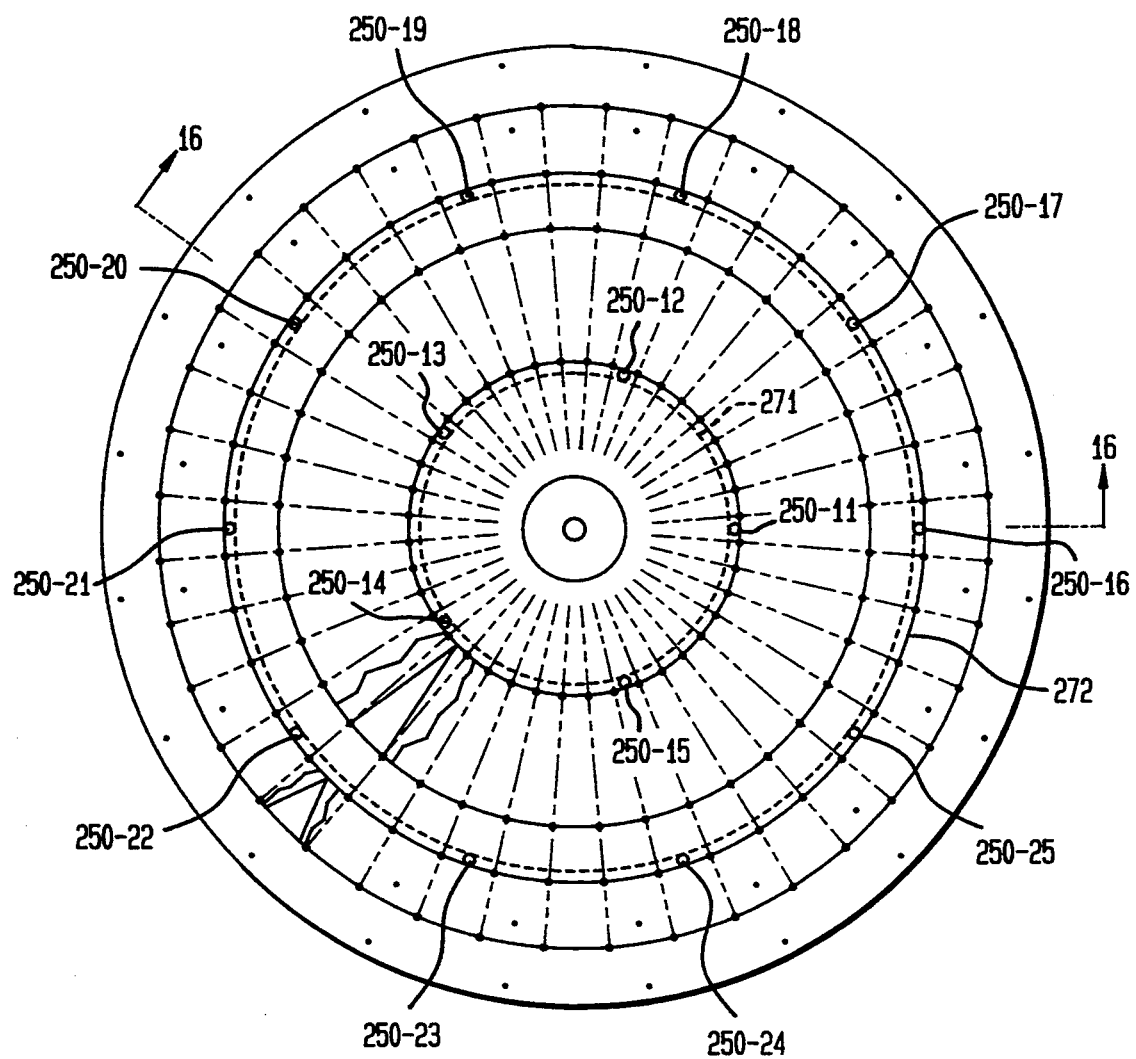
FIG. 19 is a schematic plan view of the upper side of the structure enclosing the lower combiner cavity of the FIG. 16 embodiment.
Figure 20:
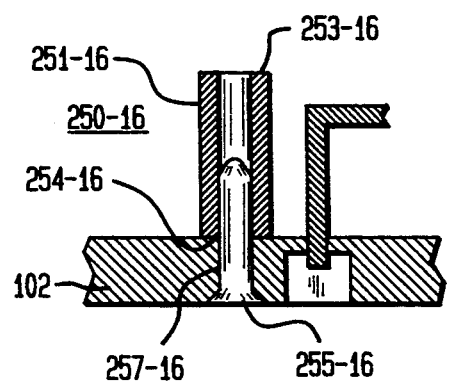
FIG. 20 is an enlarged view in cross-section of one of the dielectric spacers of the outer ring of spacers used in conjunction with the combiner cavity of the FIG. 16 embodiment.

In the FIG. 16 embodiment, the cavity closure means enclosing the upper splitter cavity 30 includes dielectric spacing means disposed in such cavity radially outward of the central boss 163 therein and extending angularly around the central axis 240 for such closure means. Such spacing means vertically extends between the plate 101 and dish 103 on the vertically opposite upper and lower sides of cavity 30 so as to contact each thereof by vertically separated contact portions of that spacing means. The mentioned spacing means takes the specific form for cavity 30 of a set of ten dielectric space units designated 250-1, 250-2, . . . 250-10 having a structure and a cooperation with the elements 101, 103 which is the same for all, and which is exemplified by the spacer 250-1 depicted in enlarged form in FIG. 18.

As shown in that last named figure, the spacer 250-1 comprises a rigid vertical circular cylindrical post 251-1 made of dielectric plastic material identified by the trademark REXOLITE which is a registered trademark of Oak Industries, a firm having offices in Rancho Bernardo, Calif. The post 251-1 has a central threaded hole 252-1 passing axially through the post between its axially opposite end faces which provide upper and lower contact portions 253-1 and 254-1 for the post. The post 251-1 is coupled at its lower end to the dish 103 by a metallic nonferromagnetic screw 255-1 which passes upward through an aluminum washer 256-1 beneath the dish 103 and, next, through an unthreaded hole in the dish and, then, into the threaded post hole 252-1. During fastening of the post to the dish, the screw 255-1 is turned in hole 252-1 to produce pressure contact between the post's contact portion 254-1 and dish 103 and to thereby fix the bottom of the post securely to that dish.

At its upper end, the post 251-1 is coupled to the plate 101 by another metallic nonferromagnetic screw 258-1 having its head received in an upper countersink 260-1 formed in the plate. The stem of screw 258-1 passes from that countersink down through an unthreaded hole 261-1 in the plate and into the threaded post hole 252-1 to be tightened therein by turning of the screw.

When the screw 258-1 is so turned, the upper end of the screw is drawn with a close fit into a lower countersink 261-1 formed in the plate 101 to produce contact between the top end of that countersink and the upper contact portion 253-1 of the post and to provide side support for the top part of the post by its close fit in that countersink. Thereby, the post 251-1 is fixedly secured to the plate 101 with the angular position of the post 251-1 relative to the dish 103 and to plate 101 being stabilized by, respectively, the effect of washer 256-1 in tending to keep post 251-1 vertical relative to dish 103 and the close fit of the post in lower countersink 261-1.

Figure 17:
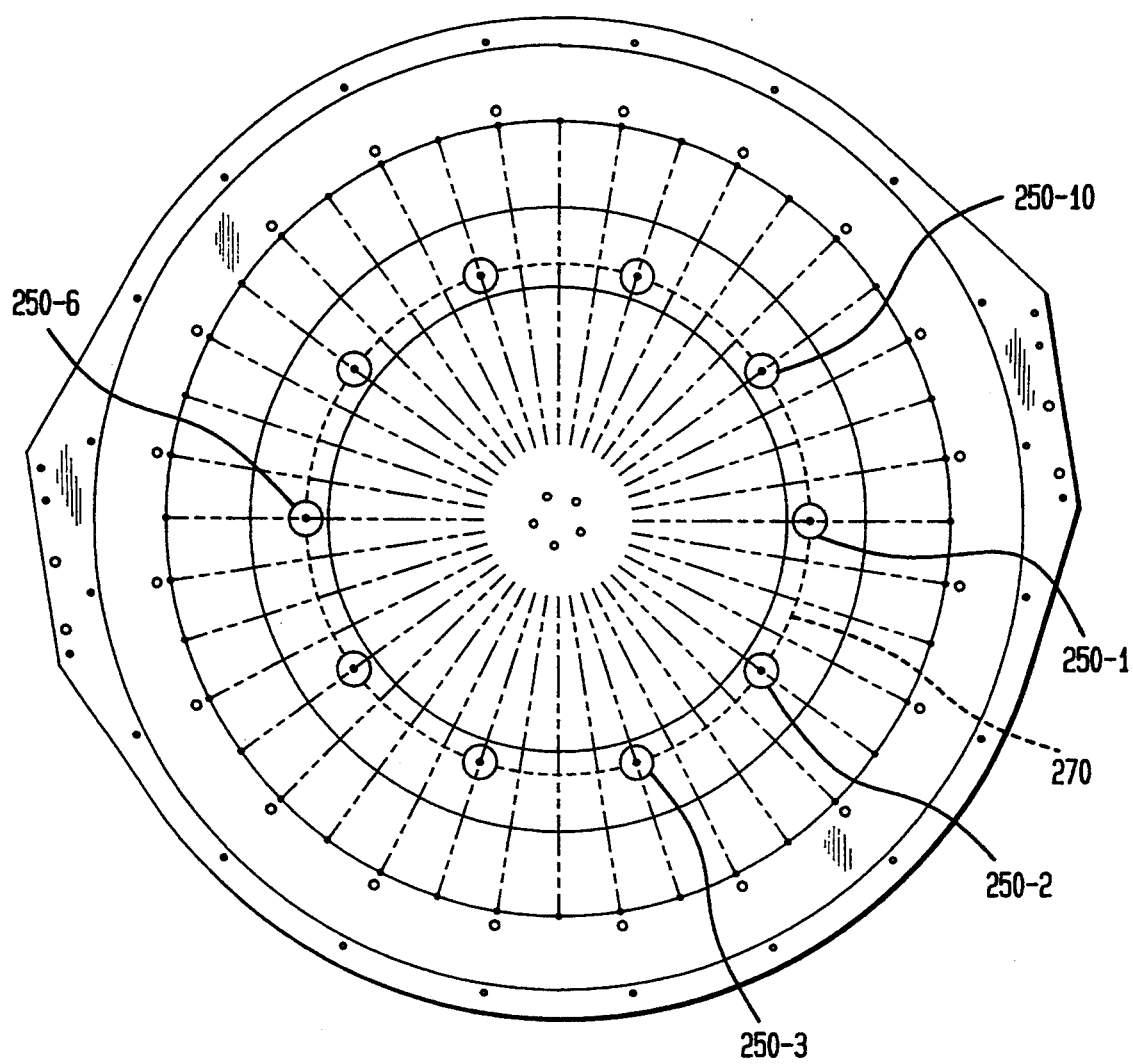
FIG. 17 is a schematic bottom view of the underside of the structure enclosing the cavity of the FIG. 16 embodiment.

As represented in FIG. 17, the ten dielectric spacer units 250-1 through 250-10 are disposed in the closure structure for cavity 30 to be spaced at equal angular intervals around a circular ring 270 coaxial with the central axis 240 of the cavity and located radially outward of the central boss 163 therein while being located radially inward of the cavity's periphery to thereby be disposed in cavity 30 radially intermediate such boss and periphery. The effect of such ring of spacer units is to maintain plate 103 and dish 101 vertically spaced apart at the radial location of the ting by a distance determined by such spacing means and equal (FIG. 18) to the distance between the upper and lower contact portions 253 and 254 of the posts 251 in the ring minus the vertical length of the lower countersinks 261 in the plate 103 which receives these posts. Because the dielectric material of which posts 251 are made has good dimensional stability with temperature change and other environmental variables, that distance remains substantially constant in the use of the described apparatus. Further, because the posts 251 in the ring 270 are fixedly secured at both ends to, respectively, the plate 101 and the dish 103, the spacer units 250 in the ring act at its radial location to prevent any significant relative movement in either vertical direction between that plate and the dish. While, however, the plate 101 and dish 103 are so constrained against vertical movement relative to each other at the location of the ring 270, the ring of spacer units permits concurrent flexing of the radially central region of the dish 103 relative to plate 101 by adjustment of the cavity tuning means comprising elements 190–195, 200–202 (FIG. 9) so as, by such adjustment, to tune the upper splitter cavity 30.

The cavity closure means for the lower combiner cavity 20 includes dielectric spacing means similar in most respects to the above-described dielectric spacing means for cavity 30 but having the following differences therefrom. In the combiner cavity 20, the dielectric spacing means therefor comprises a first set of five spacer units 250-11 through 250-15 spaced at equal angular intervals around an inner circular ring 271 and a second set of ten coaxial spacer units 250-16 through 250-25 spaced at equal angular intervals around an outer circular ting 272. The rings 271 and 272 are concentric and both coaxial with the central axis 240 for the cavity, and both of those rings are disposed radially outward of the central boss 162 in the cavity 20.

The spacer units 250-11 through 250-16 differ from the spacer units 250-1 through 250-10 in cavity 20 as follows. First, and taking the unit 250-11 (FIG. 16) as exemplary of the other units 250-12 through 250-16, the head of the upper screw 258-11 is flush with the surface away from cavity 20 of the upper wall means, bounding that cavity, rather than being recessed in relation to that surface as is the head 258-1 (FIG. 8) of the comparable spacer unit 250-1 in cavity 30. Second, spacer unit 250-11 does not have any washer comparable to the washer 256-1 of the spacer unit 250-11.

In their functioning, however, the spacer units 250-1 through 250-10 and the spacer units 250-11 through 250-16 are alike. That is, each of the latter spacer units makes contact by the upper and lower contacts at the opposite ends of the dielectric posts of the unit with, respectively, the dish 104 and plate 102 bounding the vertically opposite upper and lower sides of cavity 20. Moreover each of those latter units is fixedly secured to both that plate and that dish to constrain relative movement therebetween in either vertical direction at the radial location of ring 271 while concurrently permitting flexing of a central region of dish 104 relative to plate 102 by adjustment of the cavity turning means 203–209 (FIG. 9) as aforedescribed to thereby tune the cavity 20.

The spacer units 250-16 through 250-25 in combiner cavity 20 differ from the units 250-1 through 250-10 in cavity 30 as follows. Taking the unit 250-16 as exemplary of the other units 250-17 through 250-25, as shown in FIG. 16, the unit 250-16 lacks any washer through which its lower screw 255-16 passes because no such washer is needed. That is, the screw 255-16 passes with a close fit through an unthreaded hole 257-16 in the rigid plate in the course of reaching and entering the threaded hole 252-16 in post 251-16, and such close fit together with the rigidity of the plate suffices to stabilize the angular position of the post relative to the plate. Further, the spacer unit 250-16 lacks any upper screw for positively securing the upper end of post 251-16 to the upper wall means (here dish 104) for the cavity. Such positive securement is not needed because, when the microwave cavity closure means shown in FIG. 16 is assembled, the annular collar 130 presses down on the top of dish 104 slightly inward of its peripheral flange 125 to urge the dish to undergo a downward resilient flexing radially inward of the collar. That resilient biasing of the dish produces a yieldable resilient maintained pressure contact between the underside of dish 104 and the upper contact portion of the post 251-16 and each of the other posts of all the other spacer units 250-17 through 250-25. The presence in cavity 20 of the outer ring 272 of spacer units does not interfere with the flexing for cavity turning purposes of the central region of dish 104 by adjustment of the cavity tuner 203–209.

The cavity closure means for combiner cavity 20 not only includes the dielectric spacing means just described but also another kind of spacing means which will now be considered. Referring to FIG. 16, it is important that in the combiner cavity 20 the flat tops 146 and 147 of the annular rings or bosses 140 and 141 be spaced from the underside of dish 104 by vertical distances which, to within close tolerance, are equal to specified nominal values for these distances. That objective is realized in part by utilizing in the cavity 20 the dielectric spacing means just described to determine the vertical spacing between the plate 102 and dish 104. In order, however, to better realize that objective, it is desirable to also, fix within a close tolerance, the vertical spacing between the tops 146 and 147 of the bosses 140 and 141 and the portions underlying those tops of the plate 102. Such fixing of that spacing is accomplished in a manner as follows.

The bosses 140 and 141 have dead spaces 148 and 149 therein. Considering first the radially outer annular boss or ring 141, its dead space 149 contains spacing means (FIG. 21) which extends angularly around the inside of the boss and which has top and bottom contact portions which (FIG. 16) are in contact with, respectively, the top portion of ring 141 and the underlying portion of plate 102 to space them apart by a distance determined by that spacing means. While such spacing means may take various forms, preferably (but not necessarily) it is provided by metal coil stock. By metal coil stock is meant metallic ribbon 275 which is of constant width between its lengthwise edges and which is called "coil" stock because it is often available in wound coil form although for the purposes hereof it need not be available in that particular form. Suitable metal coil stock for the FIG. 16 embodiment is aluminum ribbon having a thickness of 20 mils and a width between its lengthwise edges of about one-quarter inch. An advantage in using such coil stock as spacing means within ting 141 is that the width dimension of such stock is kept constant over its length to within a small tolerance.

When metal coil stock is used as a spacing means in ting 141, it is disposed within the dead space 149 in the ring so that the width dimension of the stock coincides with the vertical direction for cavity 20, and so that the lengthwise edges of the stock serve as the top and bottom portions of the spacing means which contact, respectively, the ting top 147 and the underlying portion of the plate 102. Consonant with that criterion, however, the coil stock spacing means within ring 141 may take various forms. For example, the stock may take the form of a partly unwound coil of ribbon with helical turns which progress from the radially inner to the radially outer sides of the interior of ting 141. In order, however, to minimize the possibility of the ribbon of the stock being bowed in its width dimension by being pressed between the ring top 149 and plate 102 or of such width dimension being tilted away from true vertical, it is preferable that the stock be angulated in the sense that separate segments of the ribbon are separated by bends in the ribbon forming angles therein between adjacent ones of the segments. Thus, as a further example, the coil stock when used as a spacing means for boss 141 may take the form of a partly unwound coil as earlier described which, further, has been angulated to have zig-zags in the ribbon.

Figure 21:
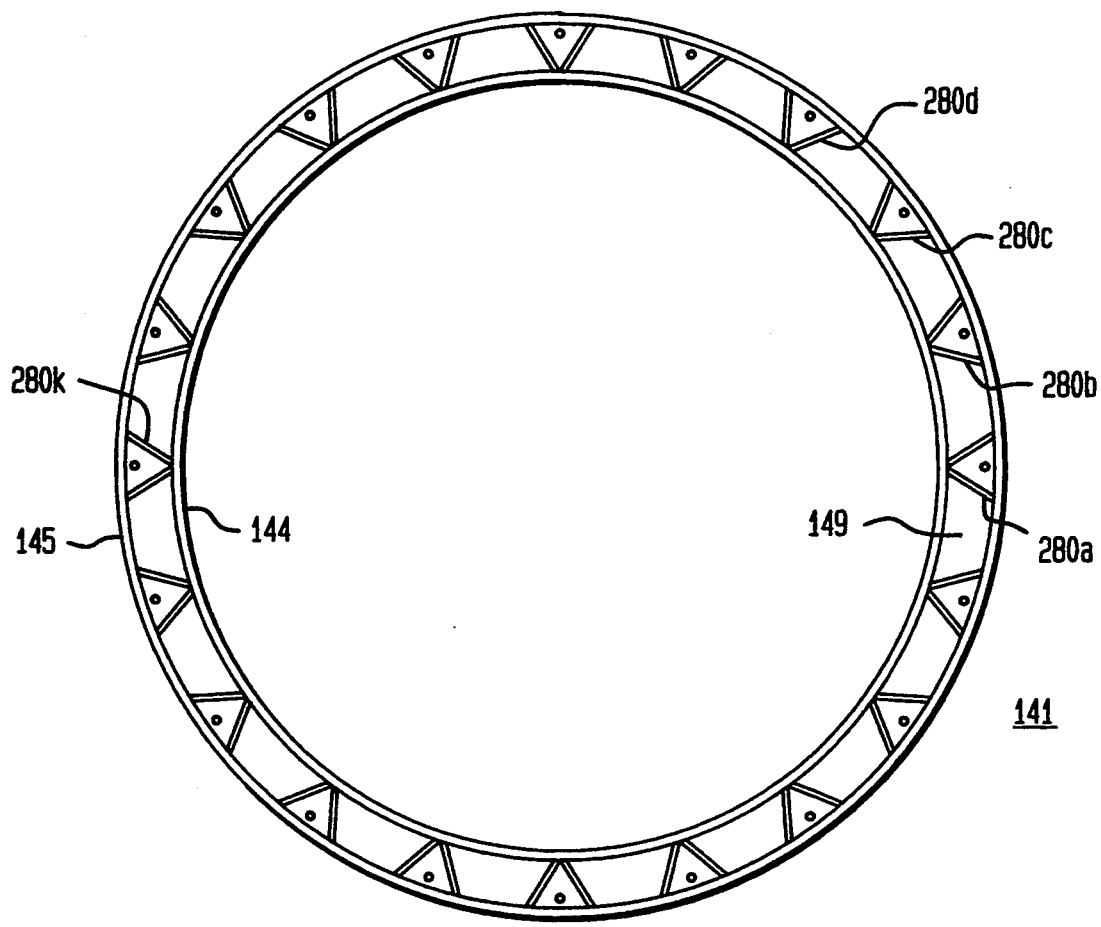
FIG. 21 is a schematic plan view in cross-section of the outer annular boss on the lower side of the FIG. 16 combiner cavity, and of a set of spacers positioned inside that boss.
Figure 22:
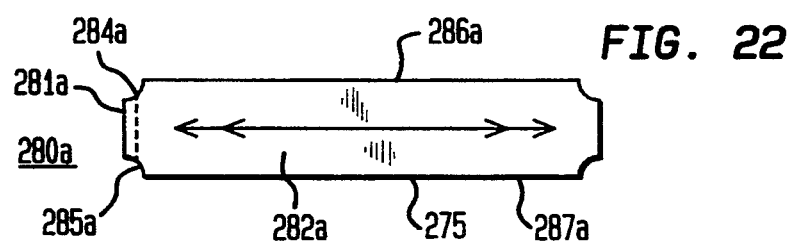
FIG. 22 is a side view of one of such spacers.
Figure 23:
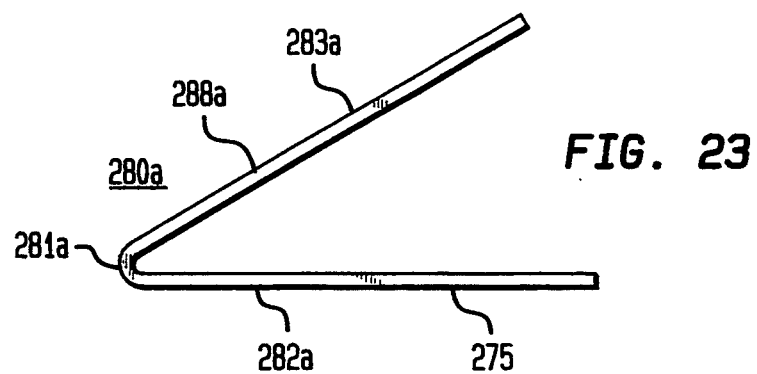
FIG. 23 is an plan view of the FIG. 22 spacer.

Preferably (but not necessarily) however, the metal coil stock used as such spacing means takes the form shown in FIGS. 21–23 in which such stock is present in ring 141 as a plurality of separate V-shaped pieces 280a, 280b, 280c . . . etc. of stock material spaced from each other at approximately equal angular intervals (FIG. 21) around the dead space 149 in the ring. The piece 280a of which details are shown by FIGS. 22 and 23 is exemplary of all the other pieces 280.

Piece 280a is made by severing a segment of the metal ribbon 275 constituting the coil stock from the wound coil of that ribbon, and by then shaping that segment to have a central bend or angle 281a and two equal length front and back arms 282a and 283a extending away from that bend and spreading apart in the horizontal plane, normal to the width dimension of ribbon 275 to give piece 280a its angular or "V" shape. Notches 284a and 285a which straddle bend 281a and the adjacent portions of arms 282a and 283a are cut into piece 280a both on its upper side and lower side, and similar upper side and lower side notches are formed in arms 282a and 283a at their free ends away from bend 281a. The purposes of having those notches is to remove from piece 280a sharp comers so as to permit piece 280a to make contact with (FIG. 16) the top 147 of boss 141, its vertical sides 144 and 145 and the plate 102 notwithstanding that the boss 141 has rounded interior wall portions (FIG. 26) at the junctions of its top 147 with its side walls 144 and 145. As well shown in FIG. 22 the front arm 282a has upper and lower lengthwise edges 286a and 287a which are vertically spaced from each other by the width dimension of the ribbon 275 and which provide top and bottom contact portions for the piece 280a. The back arm 283a has a similar upper edge 288a and lower edge (not shown) which provide top and bottom contact portions for the piece 280a and which lie in the same horizontal planes as do, respectively, the edges 286a and 287a.

Figure 26:
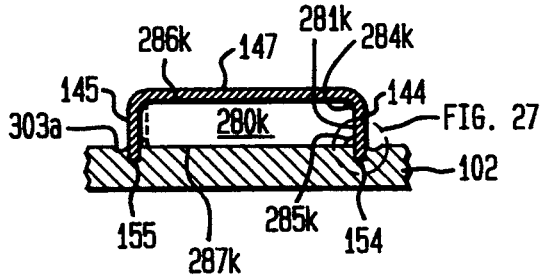
FIG. 26 is a schematic view in cross-section in a radial-vertical plane, taken as indicated by the arrows 26—26, in FIG. 25 of the mentioned segment.

In fabricating the microwave cavity closure means shown in FIG. 16, the various metal coil stock pieces 280 to be used in ring 141 are laid on the upper surface of plate 102 within the annular portion thereof between the grooves 154 and 155 to be mutually spaced at substantially equal angular intervals around that portion. The ring 141 is next placed over plate 102 and lowered to insert the peripheral vertical flanges 144 and 145 of the ring into the grooves 154 and 155, respectively, and, therefor, to advance the lower ends of those flanges down into such grooves. The downward movement of such flanges into grooves 154 and 155 is not, however, arrested by the lower ends of such flanges reaching the bottom of those grooves (FIG. 26). Instead it is arrested by the coming into contact of the top portion 147 of ring 141 with the top contact portions 286, 288 of the metal stock pieces 280 on plate 102 with the mentioned annular surface portion surface. Since the bottom contact portions of those stock pieces are then in contact with the upper surface of plate 102, such coming into contact of the ring top 147 with those "V" pieces 280 vertically spaces such top from the plate 102 by a distance determined by the accurate vertical dimensioning of such pieces. The metal coil stock pieces 280 thus perform two functions, namely, (a) to act as a stop limiting downward movement of the ring or boss 141 relative to plate 102, and (b) to establish a vertical spacing between the top 147 of the ring and the underlying portion of plate 102 which is accurately determined by the width dimensioning of those pieces independently of any variations which may occur in the vertical lengths of the peripheral flanges 144 and 145 downstanding from the top of that ring.

Figure 24:
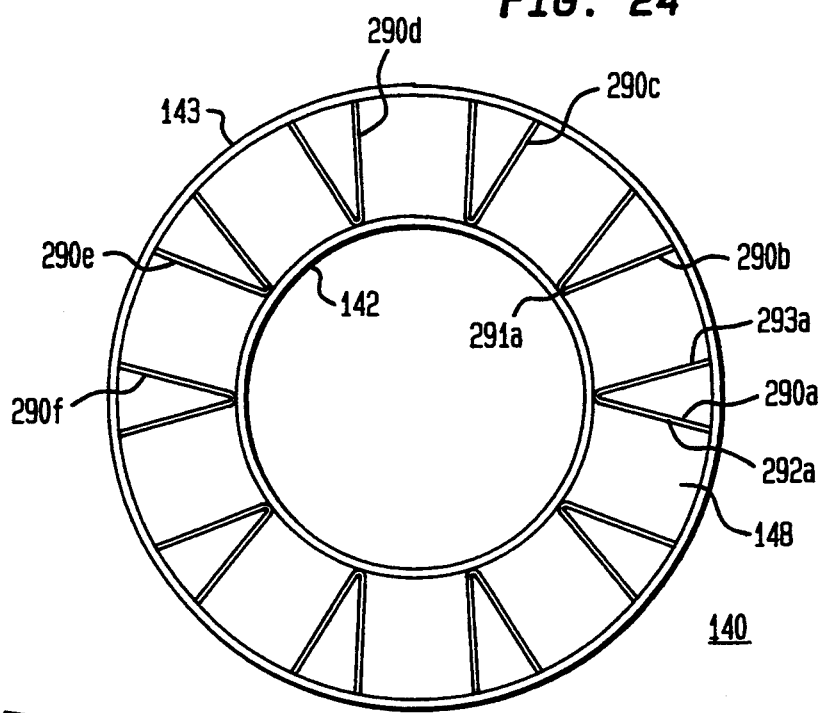
FIG. 24 is a schematic plan view in cross-section of the inner annular boss of the FIG. 17 combiner cavity and of a set of spacers inside that boss.

The top 146 of the inner annular ring 140 is similarly vertically positioned relative to the plate 102 to have a vertical spacing therefor determined by a set of V-shaped metal coil stock pieces 290 disposed in the dead space 148 in that ring as shown in FIG. 24 and functioning in the same way in relation to ring 140 as pieces 280 do in relation to ring 141. As exemplified by piece 290a (FIGS. 16 and 24), it has front and back arms 292a and 293a diverging outward from a bend or angle 291a common to those arms, and pieces 290 are otherwise similar in structure to the pieces 280 except that the pieces 290 are somewhat smaller in their width dimension.

Figure 25:
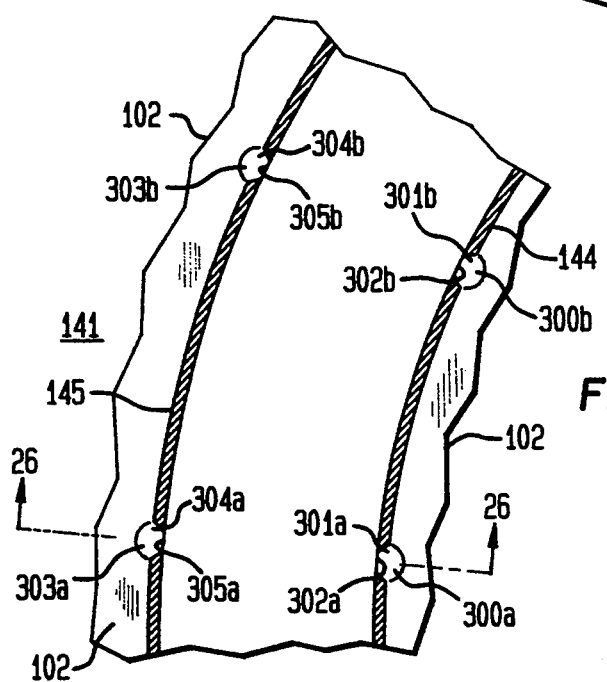
FIG. 25 is a schematic plan view of a broken-away segment of the FIG. 21 boss.
Figure 27:
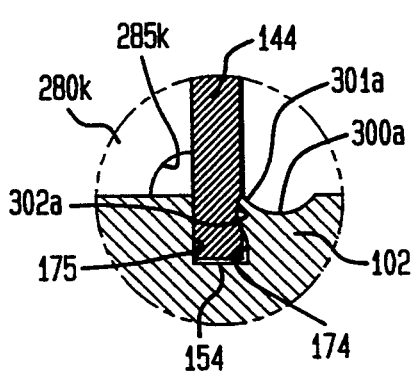
FIG. 27 is an enlarged view in cross-section of some details shown in FIG. 26.

FIGS. 25, 26 and 27 show a means for fastening 141 to plate 102 which is an alternative to, or supplement to, the earlier described means for effecting such fastening which has been earlier described, and which involves the use of the sets of vertical access holes 156, 157, 158, 159. In the mode of fastening depicted by FIGS. 25-27, the upper surface of the plate 102 has formed therein a set of depressions 300a, 300b . . . etc. outside of and adjacent to the flange 144 of ring 141 and spaced and angular intervals from each other all around the ring 141. Directly inward of those depressions, the radially outer bounding wall 174 of groove 154 has formed therein, at the intersection of that wall with the surface of plate 102, a set of bulges 300a, 300b . . . etc. projecting radially inward from the nominal circular configuration of wall 174 to press against the outside of the ring flange 144. Bulges 300a, 300b . . . are formed by the use of a swaging tool which is applied to the sites now occupied by depressions 300 to displace constituent material of the plate 102 away from those sites and to the locations now occupied by the bulges 301 so as to thereby form both those bulges and those depressions. Such material is driven by that tool with such great force towards the ring flange 144 that the outside of such flange is indented to have formed therein shallow concave hollows 302a, 302b . . . in which the bulges 301a, 301b . . . are conformably seated to make pressure contact in those hollows with the flange. Moreover, the bulges 300 during and after their formation force the flange 144 into pressure contact with the radially inner bounding wall 175 of the groove 154. The effects just described serve to fixedly secure the flange 144 to the plate 102 and to produce good electrical contact therebetween.

The radially outer flange 145 of ring 141 is (FIG. 25) similarly fixedly secured to plate 102 and electrically coupled thereto by way of bulges 304a, 304b . . . formed by material driven out of the plate towards the flange by a swaging tool (not shown) to leave behind depressions 303a, 303b . . . in the plate's surface and to be conformably seated in concave shallow hollows 305a, 305b . . . indented into the outside of flange 145 by the force of the swaging exerted on the flange through the bulges 304 as they are being formed. Thus, the ring 141 is fixedly fastened to, and makes good electrical contact with, plate 102 on both the radially inner and radially outer sides of the ring.

The ring 140 is fixedly secured and electrically coupled to the plate in the same way as has just been described for ring 141. Further the peripheral flange 106 of the dish 103 which bounds splitter cavity 20 is fixedly secured and electrically coupled to the upper plate 101 by the same use of a swaging tool to produce bulges belonging to the plate and seated in hollows belonging to the flange and formed in the outside thereof by the driving by the force from the swaging tool of such bulges into the flange.

The above described embodiment being exemplary only, it is to be understood that additions thereto, omissions therefrom and modifications thereof can be made without departing from the spirit of the invention. For example, although the invention has been disclosed and claimed with reference to a particular orientation thereof in space (the words "horizontal" and "vertical", for example, being used to describe certain elements of the invention), it is to be understood that the invention is not limited to having any particular spatial orientation. Accordingly, the invention is not to be considered as limited save as is consonant with the recitals of the following claims.

We claim:

1. The improvement in microwave cavity closure means comprising: lower and upper vertically spaced horizontally extending metallic wall means bounding vertically opposite sides of a microwave cavity having a central vertical axis and extending horizontally between such two wall means radially from said axis outward to a periphery of said cavity, said lower and upper wall means comprising, respectively, a metallic plate and a sheet metal dish which are rigid and flexible, respectively, relative to each other; said plate having a side towards said cavity, at least one annular ring disposed coaxially with said axis on said side of said plate towards said cavity, said ring comprising sheet metal having a central annular top portion spaced downward from said upper wall means and inflected at the radially opposite margins of said ring to provide therefor a pair of annular flanges downstanding from said top portion and having lower ends received in annular grooves extending into said plate from said side thereof by downward movement of said flanges into said grooves, said ring forming on said plate a raised hollow annular boss having a dead space therein between said top portion of said ring and an underlying portion of said plate disposed radially within said grooves; said improvement comprising: ring spacing means disposed in said dead space and extending angularly around the inside of said boss, said ring spacing means having top and bottom contact portions which are in contact with, respectively, said top portion of said ring and said underlying portion of said plate to vertically space them apart by a distance determined by said spacing means.

2. The improvement according to claim 1 in which the lower ends of said ring flanges are disposed above the bottoms of said grooves in said plate, and in which said ring spacing means provides a stop for arresting downward movement of said flanges into said grooves upon the coming into contact of said top and bottom contact portions of said spacing means with, respectively, said top portion of said ring and said underlying portion of said plate.

3. The improvement in microwave cavity closure means comprising: lower and upper vertically spaced horizontally extending metallic wall means bounding vertically opposite sides of a microwave cavity having a central vertical axis and extending horizontally between such two wall means radially from said axis outward to a periphery of said cavity, said lower and upper wall means comprising, respectively, a metallic plate and a sheet metal dish which are rigid and flexible, respectively, relative to each other; said plate being made of material and having a side towards said cavity, at least one annular ring disposed coaxially with said axis on said side of said plate towards said cavity, said ring comprising sheet metal having a central annular top portion each having a periphery and and inflected at the radially opposite margins of said ring to provide therefor a pair of annular flanges spaced downward from said upper wall means downstanding from said top portion and having lower ends received in annular grooves extending into said plate from said side thereof towards said cavity, said improvement comprising: a plurality of shallow hollows formed on the outside of each of said flanges and extending around the periphery thereof in angularly spaced relation with each other adjacent to said surface of said plate, and a plurality of bulges of the material of said plate extending from said plate towards the outside of each of said flanges and, respectively, corresponding to ones of said flanges, said bulges being each seated in the corresponding one of said hollows to secure said ring to said plate and electrically couple said ring and plate together through said bulges and hollows.

4. The improvement in microwave cavity closure means comprising: lower and upper vertically spaced horizontally extending metallic wall means bounding vertically opposite sides of a microwave cavity having a central vertical axis and extending horizontally between such two wall means radially from said axis outward to a periphery of said cavity, said lower and upper wall means comprising, respectively, a metallic plate and a sheet metal dish which are rigid and flexible, respectively, said plate having a side towards said cavity, at least one annular ring disposed coaxially with said axis on said side of said plate towards said cavity, said ring comprising sheet metal having a central annular top portion spaced downward from said upper wall means and a pair of annular flanges downstanding from said top portion to reach said plate, said ring forming on said plate a raised hollow annular boss having a dead space therein between said top portion of said ring and an underlying portion of said plate; said improvement comprising: spacing means disposed in said space to vertically space said top portion of said ring from said underlying portion of said plate by a distance determined by said spacing means.

5. The improvement according to claim 4 in which said spacing means comprises metal coil stock ribbon having its width dimension vertically aligned in said dead space.

6. The improvement according to claim 5 in which said metal coil stock ribbon in said dead space has a plurality of bends therein forming angles in said ribbon.

7. The improvement according to claim 6 in which said metal coil stock ribbon in said dead space comprises a plurality of separate segments of ribbon with each segment of ribbon having a bend therein joining two arm portions of that segment, and with said segments being angularly spaced around the interior of said hollow annular boss.

* * * * *